United States Patent [19]

Glover

[11] Patent Number: 4,763,332

[45] Date of Patent: Aug. 9, 1988

[54] SHARED CIRCUITRY FOR THE ENCODING AND SYNDROME GENERATION FUNCTIONS OF A REED-SOLOMON CODE

[75] Inventor: Neal Glover, Boulder County, Colo.

[73] Assignee: Data Systems Technology Corp., Broomfield, Colo.

[21] Appl. No.: 20,503

[22] Filed: Mar. 2, 1987

[51] Int. Cl.$^4$ ............................................. G06F 11/10
[52] U.S. Cl. ......................................... 371/37; 371/38
[58] Field of Search .................... 371/37, 38, 39, 40

[56] References Cited

U.S. PATENT DOCUMENTS 4,562,577 12/1985 Glover .............................. 371/39 X
4,597,083 6/1986 Stenerson .......................... 371/38 X Primary Examiner—Jerry Smith
Assistant Examiner—Robert W. Beausoliel
Attorney, Agent, or Firm—James R. Young

[57] ABSTRACT

Apparatus is disclosed for providing an improved encoder and frequency-domain syndrome generator circuit implementing Reed-Solomon codes which reduces hardware by sharing circuitry between the encoding and frequency-domain syndrome generation functions. Self-checking for proper encoder operation during write operations is achieved by verifying that all remainders from dividing codewords by factors of the code generator polynomial are equal to zero after encoding. Apparatus implements fast finite-field multiplication by a selected constant using Read Only Memory circuits. Hardware required is further reduced by incorporating Random Access Memory circuits and employing time-multiplexing techniques. Interleaved codewords are supported by implementing memory circuits for storing intermediate results of other codewords while processing symbols from one codeword.

25 Claims, 10 Drawing Sheets

| 1000 | 1001 | 1002 | 1003 | 1004 | 1005 | 1006 | 1007 | 1008 | 1009 | 1091 | 1092 | 1093 | 1095 | 1072 | 1077 |
|---|---|---|---|---|---|---|---|---|---|---|---|---|---|---|---|
| CLK | SEL | RWD | D_R | $P_0$ | $P_1$ | $P_2$ | $S'_0$ | $S'_1$ | $S'_2$ | $P*K_{2,0}$ | $P*K_{2,1}$ | $P*K_{2,2}$ | SUM | E_S | RWE |
| 0 | 0 | 0 | 0 | 0 | 0 | 0 | 0 | 0 | 0 | 0 | 0 | 0 | 0 | 0 | 0 |
| 1 | 0 | 0 | 0 | 0 | 0 | 0 | 0 | 0 | 0 | 0 | 0 | 0 | 0 | 0 | 0 |
| 2 | 0 | 0 | 0 | 0 | 0 | 0 | 0 | 0 | 0 | 0 | 0 | 0 | 0 | 0 | 0 |
| 3 | 0 | 1 | 1 | 1 | 1 | 1 | 1 | 2 | 4 | 7 | 3 | 3 | 7 | 0 | 0 |
| 4 | 1 | X | 7 | 6 | 5 | 3 | 6 | 1 | 7 | 4 | 4 | 5 | 5 | 0 | 0 |
| 5 | 1 | X | 5 | 3 | 4 | 2 | 3 | 3 | 3 | 2 | 7 | 6 | 3 | 0 | 0 |
| 6 | 1 | X | 3 | 0 | 0 | 0 | 0 | 0 | 0 | 0 | 0 | 0 | 0 | 1 | 0 |

| 1000 | 1001 | 1002 | 1003 | 1004 | 1005 | 1006 | 1007 | 1008 | 1009 | 1091 | 1092 | 1093 | 1095 | 1072 | 1077 |
|---|---|---|---|---|---|---|---|---|---|---|---|---|---|---|---|
| CLK | SEL | RWD | D_R | $P_0$ | $P_1$ | $P_2$ | $S'_0$ | $S'_1$ | $S'_2$ | $P*K_{2,0}$ | $P*K_{2,1}$ | $P*K_{2,2}$ | SUM | E_S | RWE |
| 0 | 0 | 0 | 0 | 0 | 0 | 0 | 0 | 0 | 0 | 0 | 0 | 0 | 0 | 0 | 0 |
| 1 | 0 | 0 | 0 | 0 | 0 | 0 | 0 | 0 | 0 | 0 | 0 | 0 | 0 | 0 | 0 |
| 2 | 0 | 0 | 0 | 0 | 0 | 0 | 0 | 0 | 0 | 0 | 0 | 0 | 0 | 0 | 0 |
| 3 | 0 | 0 | 0 | 0 | 0 | 0 | 0 | 0 | 0 | 0 | 0 | 0 | 0 | 0 | 0 |
| 4 | 0 | 7 | 7 | 7 | 7 | 7 | 7 | 5 | 1 | 3 | 2 | 2 | 3 | 0 | 0 |
| 5 | 0 | 5 | 5 | 2 | 0 | 4 | 2 | 0 | 6 | 5 | 0 | 7 | 2 | 0 | 0 |
| 6 | 0 | 3 | 3 | 1 | 3 | 5 | 1 | 6 | 2 | 7 | 5 | 4 | 6 | 1 | 1 |

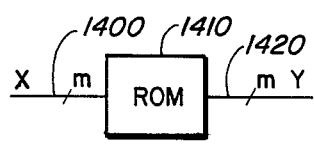
FIG.14
(PRIOR ART)
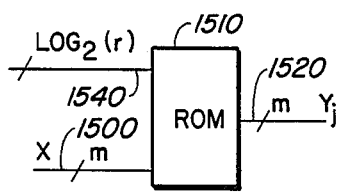
FIG.15
(PRIOR ART)
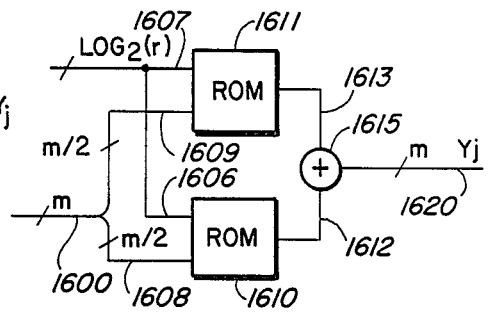
FIG.16
FIG.17
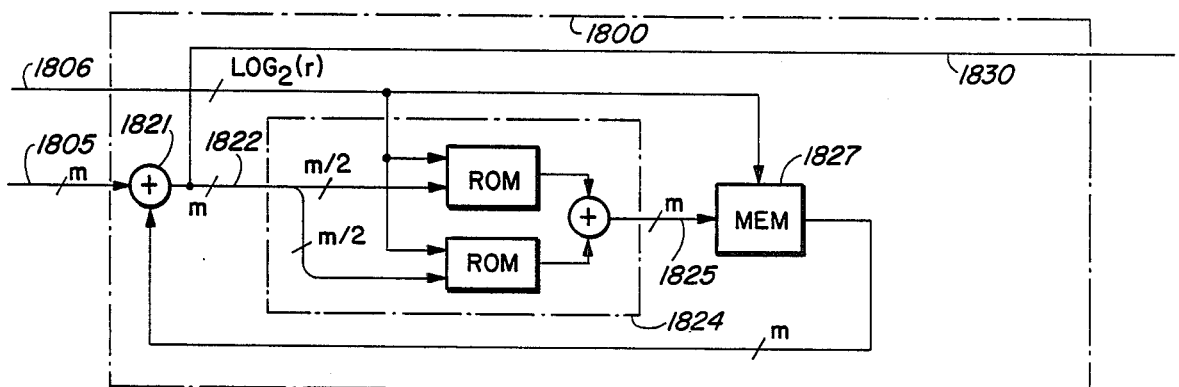
FIG.18
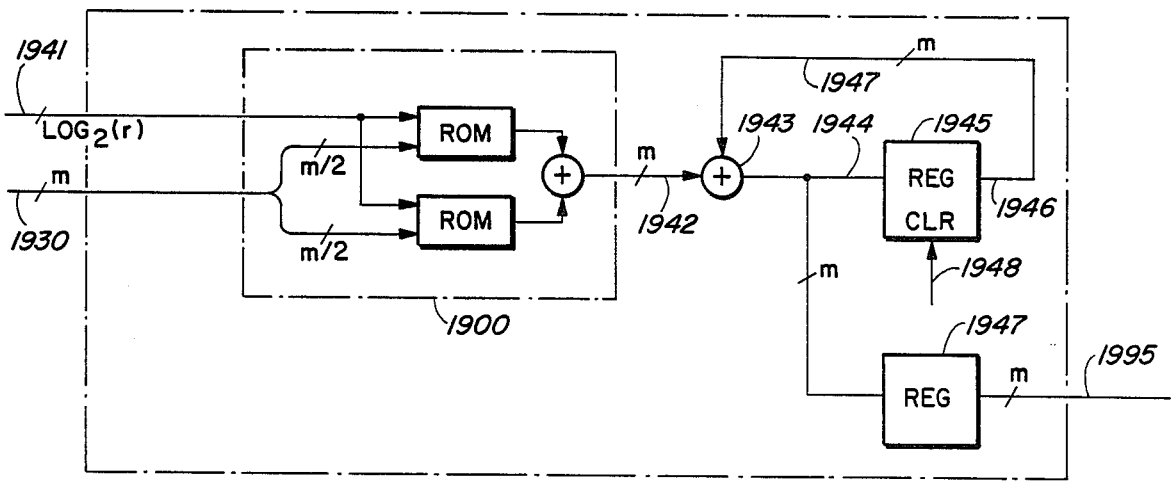
FIG.19

SHARED CIRCUITRY FOR THE ENCODING AND SYNDROME GENERATION FUNCTIONS OF A REED-SOLOMON CODE

BACKGROUND OF THE INVENTION

This invention relates to information storage and retrieval systems, and more particularly to means for encoding and decoding codewords for use in error detection and correction in such information storage and retrieval systems.

Digital information storage devices, such as magnetic or optical disk or tape, store information in the form of binary bits. Also information transmitted between two digital devices, such as computers, is transmitted in the form of binary bits. During transfer of data between devices, or during transfer between the magnetic or optical media and the control portions of a device, errors sometimes occur. Errors can also be caused by defects in the magnetic or optical storage medium. These errors must be corrected if the storage device or transmission channel is to be useful.

Correction of this information is accomplished by deriving additional bits of information, called check bits or redundancy, by processing the data mathematically, appending the check bits to the original data bits during the transmission or storage process, and reprocessing the data and check bits mathematically to detect and correct erroneous data bits at the time the information is received or retrieved. The process of deriving the check bits is called encoding and one class of codes often used in the process of encoding is Reed-Solomon codes.

Encoding of error correction information using a Reed-Solomon code is accomplished by processing a set of k data symbols, called a data block, to devise a set of r check symbols, also called redundancy symbols; each symbol is made up of m binary bits of information and is an element of a finite field $GF(2^m)$. An encoder divides a polynomial whose coefficients are the k data symbols by the generator polynomial of the code, which is of degree r. The r coefficients of the remainder of this division are the r check symbols which are appended to the data block to form a codeword which is transmitted over the signal channel or stored in an information storage device.

When a codeword is received from the signal channel or read from the storage device, a frequency-domain syndrome generator processes the received codeword by dividing it by each of the r factors of the generator polynomial of the code. The r remainders of these divisions form r frequency-domain syndrome symbols which a decoder uses to detect the presence of error(s) and to correct any error(s) present before transferring the data bits for further processing.

Encoding (dividing by the code generator polynomial) and frequency-domain syndrome generation (dividing by each factor of the code generator polynomial) each require complicated hardware which is expensive to implement. Methods for sharing circuity between these functions to reduce the cost of implementing powerful error correction codes such as the Reed-Solomon codes are required to meet continuing demands for lower cost and higher performance in information storage and retrieval devices.

Since many data storage devices are used for archival purposes wherein many write operations take place between read operations, a hardware failure may fail to be detected until many erroneous data have been written. This is a catastrophic error situation which may not be detected until data are read back after periods as long as ten years.

It is thus apparent that there is a need in the art for an improved encoding and frequency-domain syndrome generating system.

BRIEF SUMMARY OF THE INVENTION

Accordingly, it is an object of the instant invention to provide an encoder and frequency-domain syndrome generator circuit which derives check bits or redundancy from a data block and frequency-domain syndrome bits from a received codeword in accordance with a Reed-Solomon code.

It is a further object of this invention to provide an encoder and frequency-domain syndrome generator circuit which shares circuitry between the encoding and frequency-domain syndrome generating functions.

It is another object of this invention to provide an encoder and frequency-domain syndrome generator circuit which incorporates self-checking for proper operation during the encoding process.

Still another object of this invention is to provide a fast circuit to accomplish finite-field multiplication of a variable element by a selectable constant element.

It is also an object of this invention to provide an encoder and frequency-domain syndrome generator circuit which reduces hardware by sharing circuitry in a time-multiplexed fashion.

These and other objects of the present invention will be apparent from the following detailed description and the appended claims.

BRIEF DESCRIPTION OF THE DRAWINGS

FIG. 14 shows a prior art circuit for multiplying a variable element by a constant element using a Read Only Memory (ROM) circuit.

FIG. 15 shows an extension of FIG. 14 for multiplying a variable element by a selectable constant element using a single large ROM circuit.

FIG. 16 shows a circuit for multiplying a variable element by a selectable constant element using a circuit employing two small ROM circuits.

FIG. 17 shows in hexadecimal form the contents of the ROM circuits of FIG. 16 for m=4, r=4, a field generator polynomial $x^4 \oplus x \oplus 1$, $G(x)=x^4 \oplus \alpha^{12}*x^3 \oplus \alpha^{4}*x^2 \oplus x \oplus \alpha^6$ and $c_j = \alpha^j$ for $0 \leq j < 4$.

FIG. 18 shows a circuit for computing parameters $P_j'$ and modified frequency domain syndromes $S_j'$ in a time-multiplexed fashion.

FIG. 19 shows a circuit for computing a Sum Of Products in a time-multiplexed fashion.

DESCRIPTION OF THE PREFERRED EMBODIMENT

The following description is of the best presently contemplated mode of carrying out the instant invention. This description is not to be taken in a limiting sense but is made merely for the purpose of describing the general principles of the invention. The scope of the invention should be determined with reference to the appended claims.

In a finite field $GF(2^m)$, elements are composed of m binary bits. Addition ($\oplus$) of elelents consists of MODULO 2 summation of corresponding bits; this is equivalent to performing the EXCLUSIVE-OR sum of operands:

$$x \oplus y = x \text{ XOR } y.$$

Note that subtraction is equivalent to addition since the MODULO 2 difference of bits is the same as their MODULO 2 sum.

Multiplication (*) of a variable by a constant may be implemented using EXCLUSIVE-OR gates, parity trees, or ROM tables.

In a decoder for an error detection and correction system using a Reed-Solomon or related code of degree r for the detection and correction of a plurality of errors in codewords of n symbols comprised of k data symbols and r check symbols, and wherein each symbol is an element of a Galois field $GF(2^m)$, a codeword polynomial $C(x)$ is defined by $$C(x) \text{ MOD } G(x) = 0 \tag{1}$$

where $G(x)$ is the code generator polymomial $$G(x) = \prod_{j=0}^{r-1} (x \oplus \alpha^{m_0+j}) = \sum_{i=0}^{r} G_i * x^i \tag{2}$$

$\alpha$ is a primitive element of the field, and $m_0$ is a parameter of the code. A code with a generator polynomial of degree r can be used to correct all cases of $t = \text{INT}(r/2)$ errors without pointers and is guaranteed to detect all cases of $\text{INT}((r+1)/2)$ errors. The minimum distance of such a code is $d_0 = r+1$.

Given a polynomial $I(x)$ whose coefficients are k data symbols, we may contruct a codeword to be transmitted or stored by computing a write redundancy polynomial $$W(x) = x^{r}*I(x) \text{ MOD } G(x) \tag{3}$$

and appending its coefficients to the data symbols:

$$C(x) = x^{r}*I(x) \oplus W(x). \tag{4}$$

Figure 1:
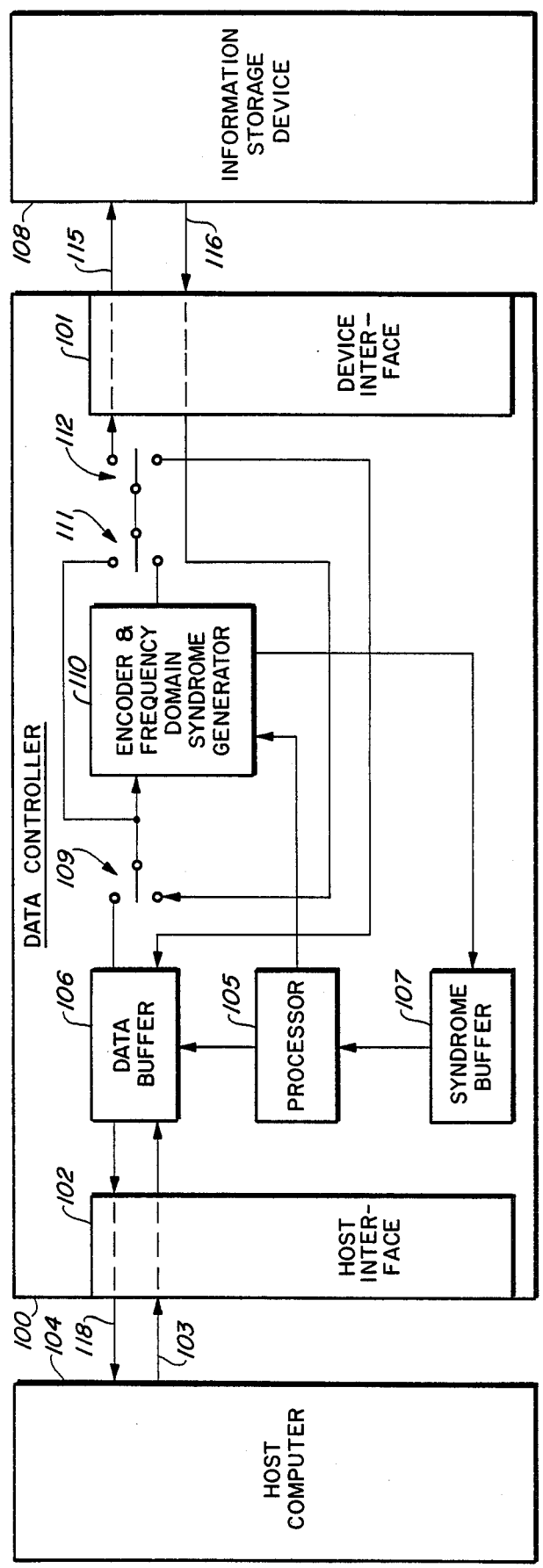
FIG. 1 shows the environment in which the instant invention is used.

Referring to FIG. 1, a data controller 100 having a host interface 102 is connected to a host computer 104. The data controller 100 also has a device interface 101 which connects the data controller 100 to an information storage device 108. In the process of writing data from host computer 104, data symbols from host computer 104 are transferred through host information channel 103, through host interface 102, through data buffer 106, through switch 109, and into encoder and frequency-domain syndrome generator 110. Data symbols and redundancy symbols are transferred from encoder and frequency-domain syndrome generator 110 through switches 111 and 112, through device interface 101, through device information channel 115 to information storage device 108.

Figure 2:
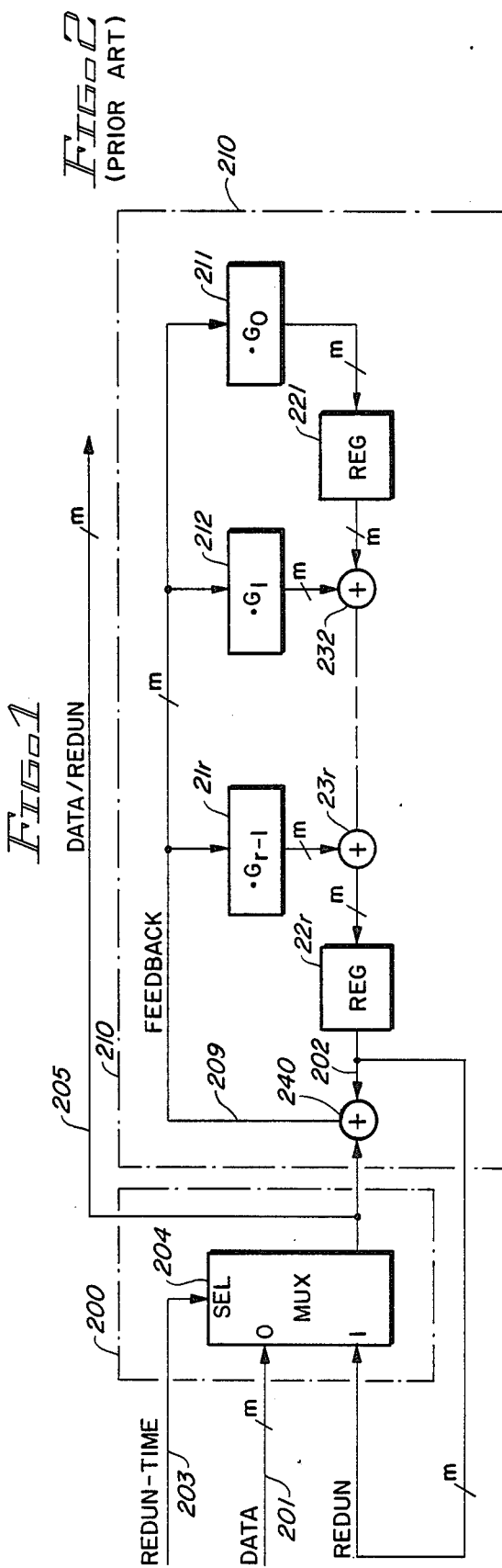
FIG. 2 shows a typical prior art encoder for generating write redundancy by dividing by G(x).

A typical prior art encoder implements equations (3) and (4) using the r-stage linear feedback shift register circuit of FIG. 2. Symbol-wide (m-bits) registers 221-22r are initialized to some known state. The circuit is clocked once for each data and redundancy symbol. During the first k clocks, REDUN_TIME signal 203 is not asserted and multiplexer 204 passes data symbols (coefficients of $I(x)$) from data bus 201 onto DATA/REDUN bus 205 and into EXCLUSIVE-OR summing circuit 240. The other input of EXCLUSIVE-OR summing circuit 240 is the output 202 of high-order register 22r. The output of EXCLUSIVE-OR summing circuit 240 is FEEDBACK signal 209 and is fed to finite-field constant multiplying circuits 211 through 21r, which multiply by $G_0$ through $G_{r-1}$ respectively. The output of multiplier 211 is fed to the input of register 221; the outputs of multipliers 212 through 21r are fed to EXCLUSIVE-OR summing circuits 232 through 23r, which modify the contents or registers 221 through 22r as they pass from low-order register 221 toward high-order register 22r. After the k data symbols have been clocked into linear feedback shift register 210, the contents of registers 221 through 22r are the desired redundancy symbols (coefficients of $W(x)$). At this time REDUN_TIME signal 203 is asserted and multiplexer 204 passes its input 202, which is the REDUN bus connected to the output of high-order register 22r, to DATA/REDUN bus 205 and into EXCLUSIVE-OR summing circuit 240. Since both inputs of EXCLUSIVE-OR summing circuit 240 are then identical, FEEDBACK signal 209 is zero, the outputs of multiplying circuits 211 through 21r are zero, and the contents of registers 221 through 22r are not altered as they pass through EXCLUSIVE-OR circuits 232 through 23r. Thus the coefficients of $W(x)$ may be clocked out of linear feedback shift register 210 through high-order register 22r, through REDUN bus 202, through multiplexer 204, and onto DATA/REDUN bus 205 on the next r clocks. The circuit of FIG. 2 forms a continuous stream of symbols comprising the coefficients of a codeword C(x).

When a codeword is received from the transmission channel or retrieved from the storage device, error(s) may be present. The received codeword is $$C'(x) = C(x) \oplus E(x), \tag{5}$$

$$E(x) = \sum_{i=1}^{e} E_i * x^{L_i} \tag{6}$$

and $E_i$ and $L_i$ are the values and locations, respectively, of e symbol errors.

Referring again to FIG. 1, in the process of reading data from information storage device 108, data symbols and redundancy symbols from information storage device 108 are transferred through device information channel 116, through device interface 101, through switch 109, and into encoder and frequency-domain syndrome generator 110. At the same time the data symbols are being transferred into the encoder and frequency-domain syndrome generator 110, they are transferred in parallel through switches 111 and 112 into data buffer 106. After the data symbols and redundancy symbols have been transferred into encoder and frequency-domain syndrome generator 110, frequency-domain syndrome symbols generated by encoder and frequency-domain syndrome generator 110 are transferred to syndrome buffer 107. After the data symbols have been transferred into data buffer 106 and frequency-domain syndrome symbols have been transferred to syndrome buffer 107, processor 105 uses frequency-domain syndrome symbols from syndrome buffer 107 to detect and correct, if necessary, errors in the data symbols in data buffer 106. After correction of any errors in the data buffer 106, the data symbols are transferred through host interface 102, through information channel 118 to host computer 104.

The frequency-domain syndromes $S_j$ are given by $$S_j = C'(x) \ MOD \ (x \oplus \alpha^{m_0+j}) \tag{7}$$

for values of $0 \leq j < r$. Equations (7) may be implemented using r Linear Sequential Circuits such as those shown in circuits 311 through 31r of FIG. 3. Symbol-wide (m bits) register 324 is initialized to some known state. Each received data/redundancy symbol is fed to input 320 of EXCLUSIVE-OR summing circuit 321. Output 322 of EXCLUSIVE-OR summing circuit 321 feeds register 324, whose output 361 feeds finite-field multiplying circuit 327. Output 328 of finite-field multiplying circuit 327 is the product of its input 361 and constant element $\alpha^{m_0}$ and is connected to the other input of EXCLUSIVE-OR summing circuit 321. Circuit 311 is clocked once per data and redundancy symbol, and output 322 of EXCLUSIVE-OR summing circuit 321 is stored in register 324 each time the circuit is clocked. After the k received data symbols and r received redundancy symbols have been clocked into the circuit, register 324 contains frequency-domain syndrome $S_0$. Operation of the remaining Linear Sequential Circuits of circuits 311 through 31r is identical to that of circuit 311, with $\alpha^{m_0}$ replaced with $\alpha^{m_0+1}$ through $\alpha^{m_0+r-1}$.

Figure 3:
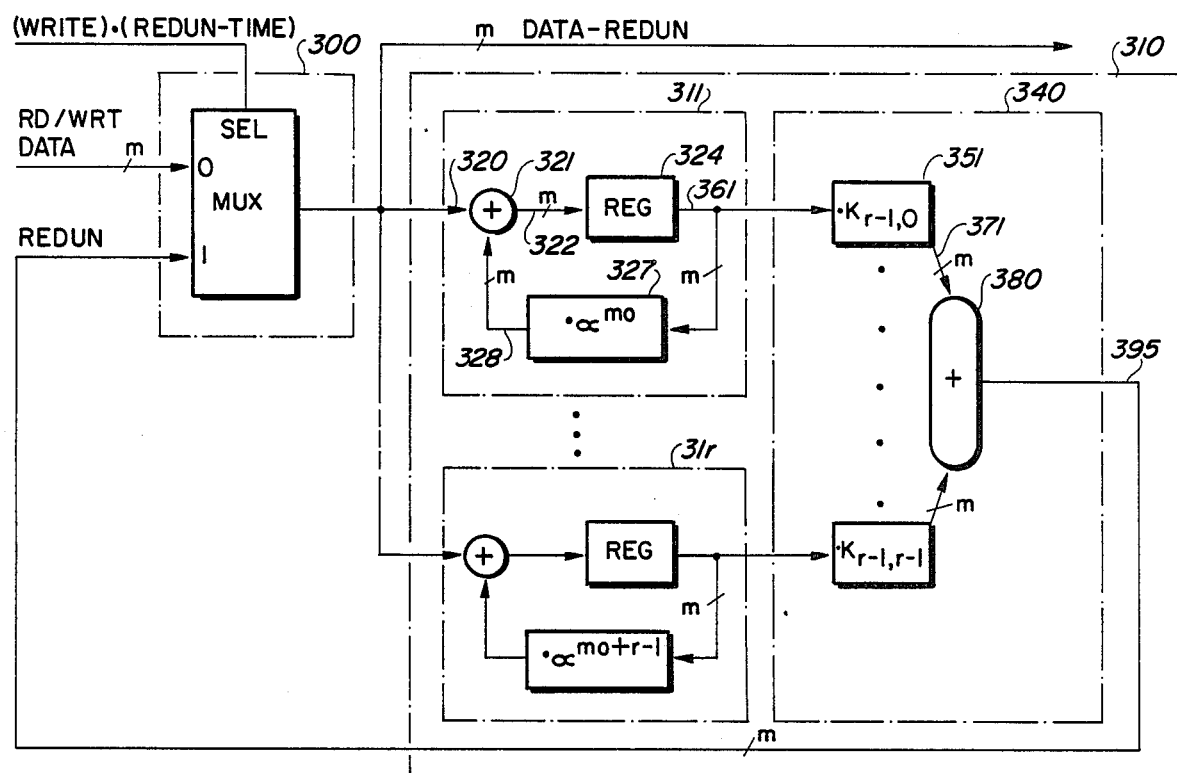
FIGS. 3, 4, and 5 show circuits for computing write redundancy and frequency-domain syndromes using shared circuitry.

Cost motivates us to find some means for reducing hardware by sharing circuitry in performing the functions of equations (3) and (7). Consider the set of parameters $$P_j = I(x) \ MOD \ (x \oplus \alpha^{m_0+j}), \tag{8}$$

which are the contents of r−1 registers of the Linear Sequential Circuits 311 through 31r of FIG. 3 after clocking in a polynomial I(x). Observe that $$P_j = \alpha^{-r(m_0+j)} * [x^r * I(x) \ MOD \ (x \oplus \alpha^{m_0+j})]. \tag{9}$$

Noting that $(x \oplus \alpha^{m_0+j})$ is a factor of G(x), we have $$P_j = \alpha^{-r(m_0+j)} * [(x^r * I(x) \ MOD \ G(x)) \ MOD \ (x \oplus \alpha^{m_0+j})], \tag{10}$$

Applying equation (3) to equations (10) gives $$P_j = \alpha^{-r(m_0+j)} * [W(x) \ MOD \ (x \oplus \alpha^{m_0+j})], \tag{11}$$

which is equivalent to $$P_j = \sum_{i=0}^{r-1} \alpha^{(i-r)(m_0+j)} * W_i. \tag{12}$$

Equations (12) give the parameters $P_j$ in terms of the write redundancy coefficients $W_i$ and powers of $\alpha$. Inversion of a matrix in a finite field is known in the art. Doing so for equations (12) gives the write redundancy coefficients $W_i$ in terms of the parameters $P_j$ and a set of transform constants $K_{i,j}$:

$$W_i = \sum_{j=0}^{r-1} K_{i,j} * P_j \tag{13}$$

Circuit 340 of FIG. 3 shows a Sum of Products Circuit which implements equation (13) for i=r−1 using r finite-field constant multiplying circuits 351 through 35r and one r symbol-input EXCLUSIVE-OR summing circuit 380. Parameter $P_0$ is output 361 generated by Linear Sequential Circuit 311 and is fed to the input of finite-field multiplying circuit 351. Output 371 of finite-field multiplying circuit 351 is the product of its input 361 and transform constant $K_{r-1,0}$ and is connected to an input of r symbol-input EXCLUSIVE-OR summing circuit 380. The output 395 of r symbol-input EXCLUSIVE-OR summing circuit 380 is also the output of Sum Of Products Circuit 340, which is connected to the REDUN input of circuit 300. Sum Of Products Circuit 340 may be implemented with XOR gates, parity trees, Read Only Memory circuits, or a combination of these.

Through the derivation above, we have seen that when given the same input, circuit 310 of FIG. 3 and circuit 210 of FIG. 2 give the same output. Since circuit 300 of FIG. 3 and circuit 200 of FIG. 2 are identical, the entire circuit of FIG. 3 performs the same function as the entire circuit of FIG. 2. Thus the circuit of FIG. 3 may be used as an encoder during a write operation. During a read operation, the Linear Sequential Circuits 311 through 31r of FIG. 3 perform the function of dividing a received codeword by factors $(x \oplus \alpha^{m_0+j})$ of G(x), and on completion of a read operation they contain the frequency-domain syndromes $S_0$ through $S_{r-1}$. Thus FIG. 3 exhibits the desired sharing of circuitry between encoding and frequency-domain syndrome generation.

Figure 4:
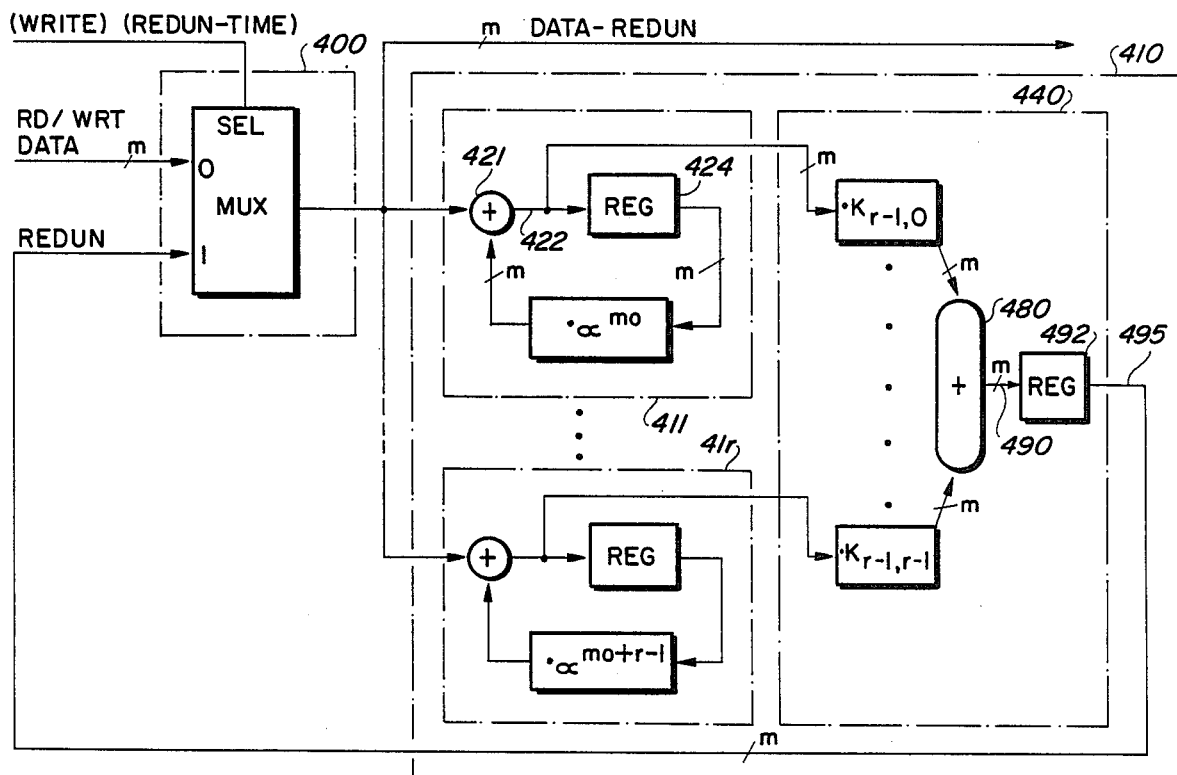

There are circumstances under which circuit 410 of FIG. 4 is preferred to circuit 310 of FIG. 3. Referring to circuit 411, its output 430 is taken from EXCLUSIVE-OR summing circuit 421, bypassing register 424; the operation of the rest of circuit 411 is identical to that of circuit 311 of FIG. 3, and the other Linear Sequential Circuits of circuits 411 through 41r are similarly modified. Referring to circuit 440, output 490 of EXCLUSIVE-OR summing circuit 480 is fed to the input of register 492 and is stored in register 492 at the same time as output 422 of EXCLUSIVE-OR summing circuit 421 is clocked into register 424 of circuit 411 (once per data and redundancy symbol). Output 495 of register 492 is also the output of Sum Of Products Circuit 440 and is connected to the REDUN input of circuit 400. The operation of the rest of circuit 440 is identical to that of circuit 340 of FIG. 3. The circuit of FIG. 4 performs the same function as the circuit of FIG. 3.

Figure 6:
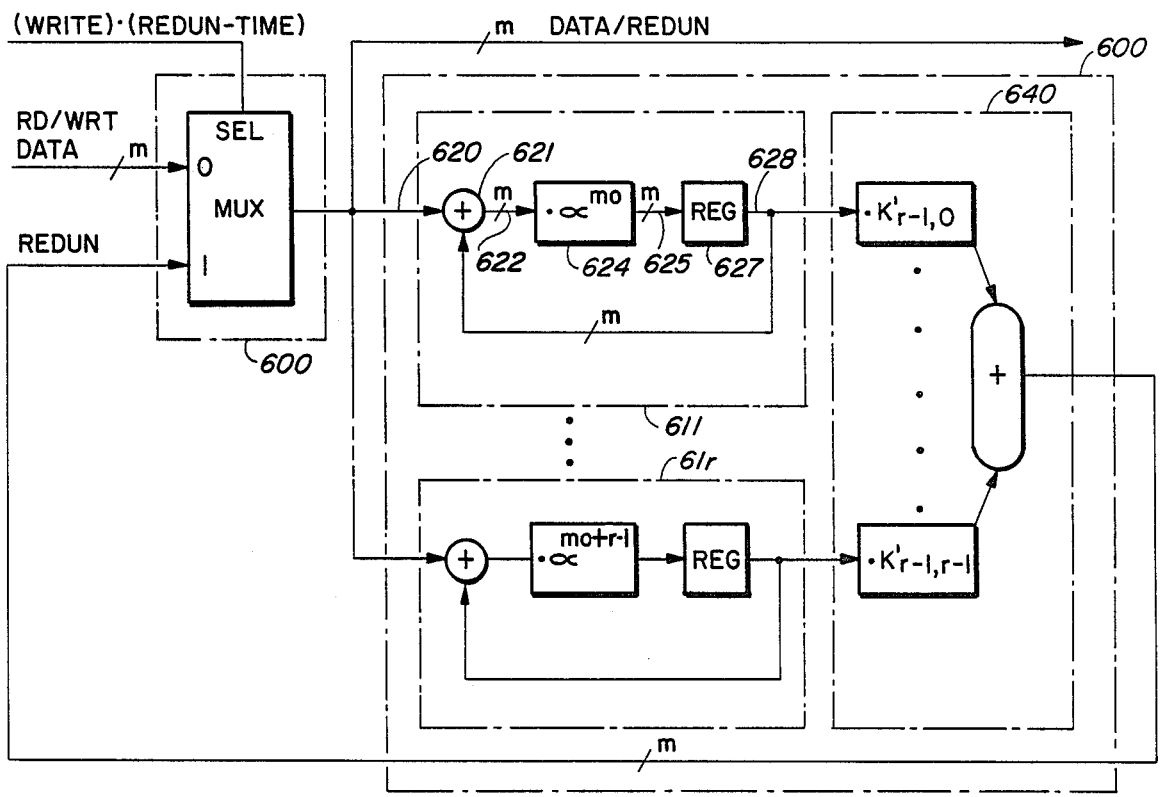
FIGS. 6, 7, and 8 show circuits for computing write redundancy and modified frequency-domain syndromes using shared circuitry.

Consider the modified frequency-domain syndromes $$S_j' = \alpha^{m0+j*}(C'(x) \text{ MOD } (x \oplus \alpha^{m0+j})) \tag{14}$$

produced by r Linear Sequential Circuits such as those shown in circuits 611 through 61r of FIG. 6. Register 627 is initialized to some known state. Each received data/redundancy symbol is fed to input 620 of EXCLUSIVE-OR summing circuit 621. Output 622 of EXCLUSIVE-OR summing circuit 621 is fed to the input of finite-field multiplying circuit 624. The output 625 of finite-field multiplying circuit 624 is the product of its input 622 and constant element $\alpha^{m0}$ and is fed to register 627. The output 628 of register 627 is connected to the other input of EXCLUSIVE-OR summing circuit 621. The output 625 of finite field multiplying circuit 624 is stored in register 627 when circuit 611 is clocked, once per data and redundancy symbol. After the k received data symbols and r received redundancy symbols have been clocked into the circuit, register 627 contains modified frequency-domain syndrome $S_0'$. Operation of the remaining Linear Sequential Circuits of circuits 611 through 61r is identical to that of circuit 611, with $\alpha^{m0}$ replaced with $\alpha^{m0+1}$ through $\alpha^{m0+r-1}$.

A decoder using these modified frequency-domain syndromes instead of the usual frequency-domain syndromes will find errors with location $L_i'$ related to the locations $L_i$ found using the usual frequency-domain syndromes according to $$L_i' = (L_i + 1) \text{MOD } (2^m - 1) \tag{15}$$

Applying equations (13) to the parameters $$P_j' = \alpha^{m0+j*}(I(x)\text{MOD }(x \oplus \alpha^{m0+j})) = \alpha^{m0+j}*P_j \tag{16}$$

gives the write redundancy coefficients $W_i$ in terms of the parameters $P_j'$ and transform constants $K_{i,j}'$:

$$W_i = \sum_{j=0}^{r-1} K_{i,j}' * P_j' \tag{17}$$

where $$K_{i,j}' = K_{i,j}/\alpha^{m0+j} \tag{18}$$

The circuit of FIG. 6 implements equations (16) and (17) to generate write redundancy and modified frequency-domain syndromes. The operation of circuit 600 is identical to that of circuit 300 of FIG. 3. The operation of Sum Of Products Circuit 640 is identical to that of circuit 340 of FIG. 3 with constants $K_{i,j}'$ in place of constants $K_{i,j}$. The circuit of FIG. 6 produces write redundancy and modified frequency-domain syndromes.

Figure 7:
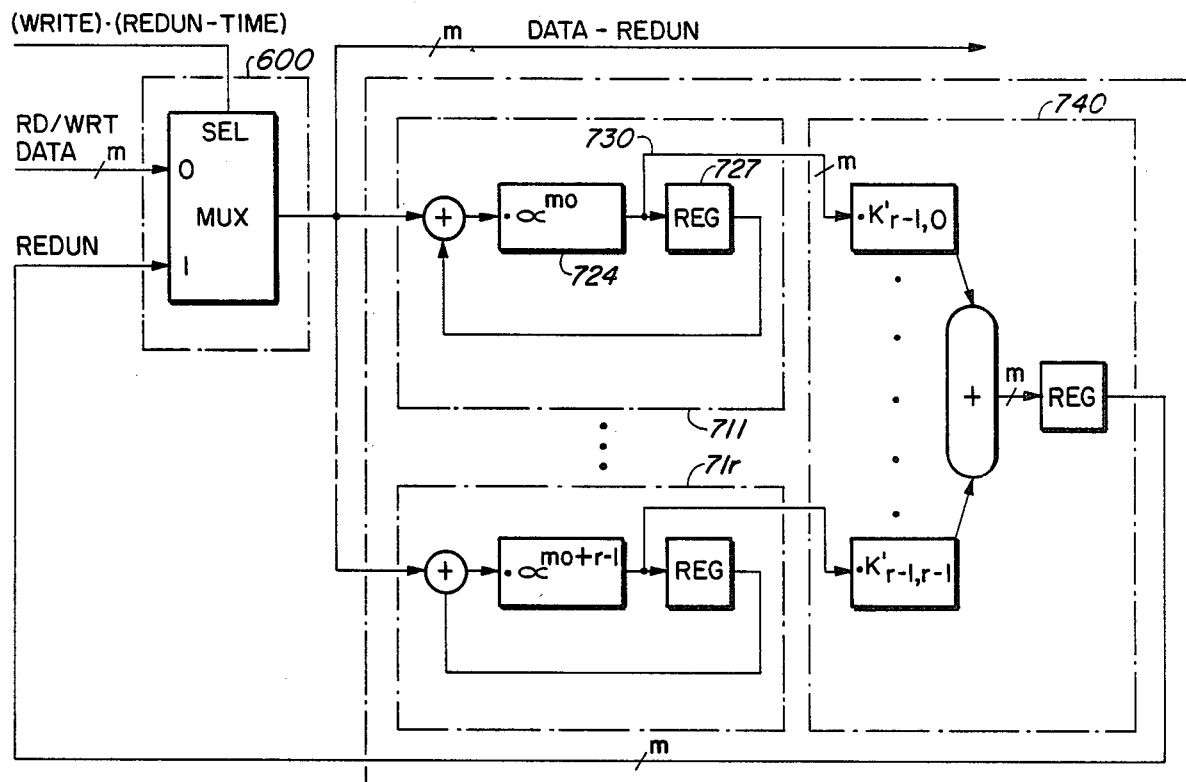

There are circumstances under which circuit 710 of FIG. 7 is preferred to circuit 610 of FIG. 6. Referring to circuit 711, its output 730 is taken from finite-field multiplying circuit 724, bypassing register 727. The operation of the rest of circuit 711 is identical to that of circuit 611 of FIG. 6, and the other Linear Sequential Circuits of circuits 711 through 71r are similarly modified. The operation of circuit 740 is identical to that of circuit 440 of FIG. 4 with constants $K_{i,j}'$ in place of constants $K_{i,j}$. The circuit of FIG. 7 performs the same function as the circuit of FIG. 6.

Figure 5:
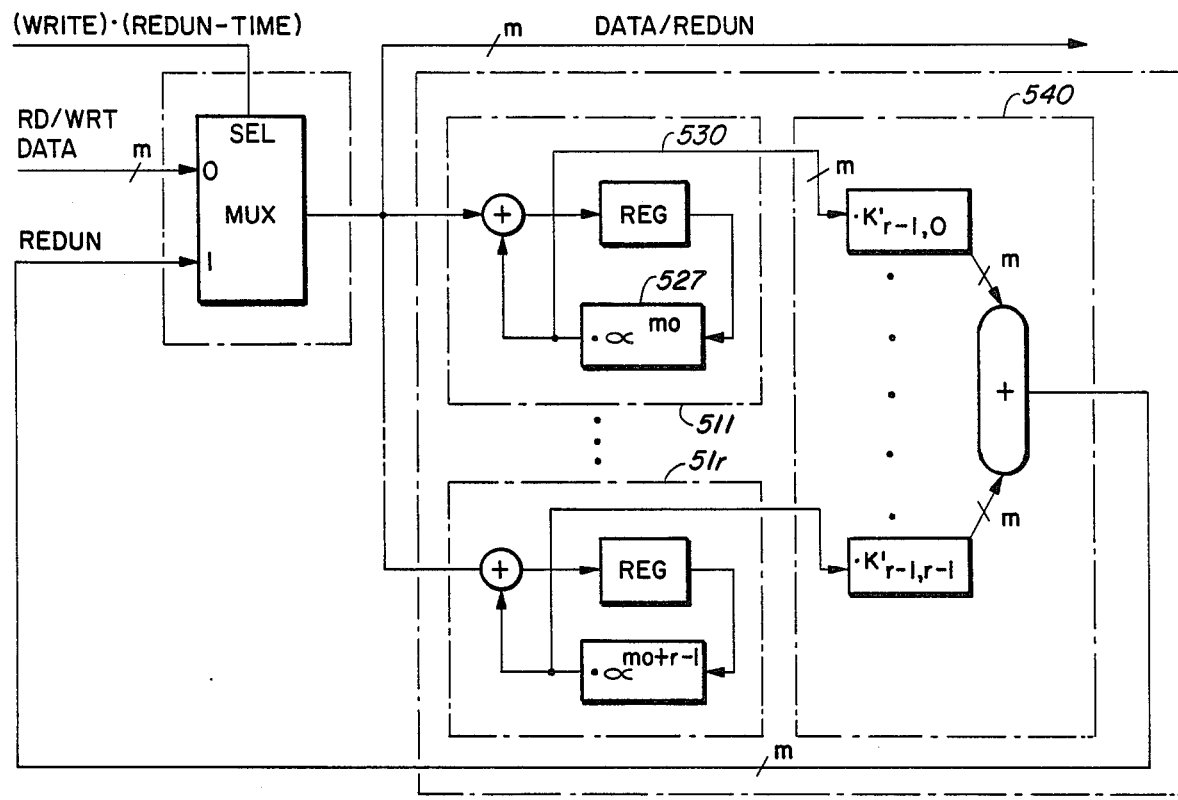

The form of Linear Sequential Circuit shown in circuits 511 through 51r of FIG. 5 generates frequency-domain syndromes $S_j$ on read but generates write redundancy using parameters $P_j'$. Here output 530 of circuit 511 is taken from finite-field multiplying circuit 527. The operation of the rest of circuit 511 is identical to that of circuit 311 of FIG. 3, and the other Linear Sequential Circuits of circuits 511 through 51r are similarly modified. The operation of circuit 540 is identical to that of circuit 640 of FIG. 6. Analogously, the form of Linear Sequential Circuit shown in FIG. 8 generates modified frequency-domain syndromes $S_j'$ on read but generates write redundancy using parameters $P_j$. Here output 830 of circuit 811 is taken from EXCLUSIVE-OR summing circuit 821, bypassing finite-field multiplying circuit 824 and register 827. The operation of the rest of circuit 811 is identical to that of circuit 611 of FIG. 6, and the other Linear Sequential Circuits of circuits 811 through 81r are similarly modified. The operation of circuit 840 is identical to that of circuit 440 of FIG. 4.

Advantageously, the contents of the registers of any of the forms of the Linear Sequential Circuits of FIG. 3, 4, 5, 6, 7, or 8 above may be used to check for proper encoder operation after a write operation. Where $$(x \oplus \alpha^{m0+j})$$

are factors of G(x), equation (1) gives $$C(x)\text{MOD}(x \oplus \alpha^{m0+j}) = 0 \tag{19}$$

Thus after a codeword has been generated, the registers of any of the forms of the Linear Sequential Circuits of FIG. 3, 4, 5, 6, 7, or 8 above must each contain zero. Many circuit failures will cause one or more of the registers to contain a non-zero value at the end of a write operation. This important feature of the instant invention requires only the addition of zero-detection circuitry to the circuits of FIG. 3, 4, 5, 6, 7, or 8, and such circuitry can perform the dual function of detecting the existence of error(s) in received codewords during a read operation.

Figure 8:
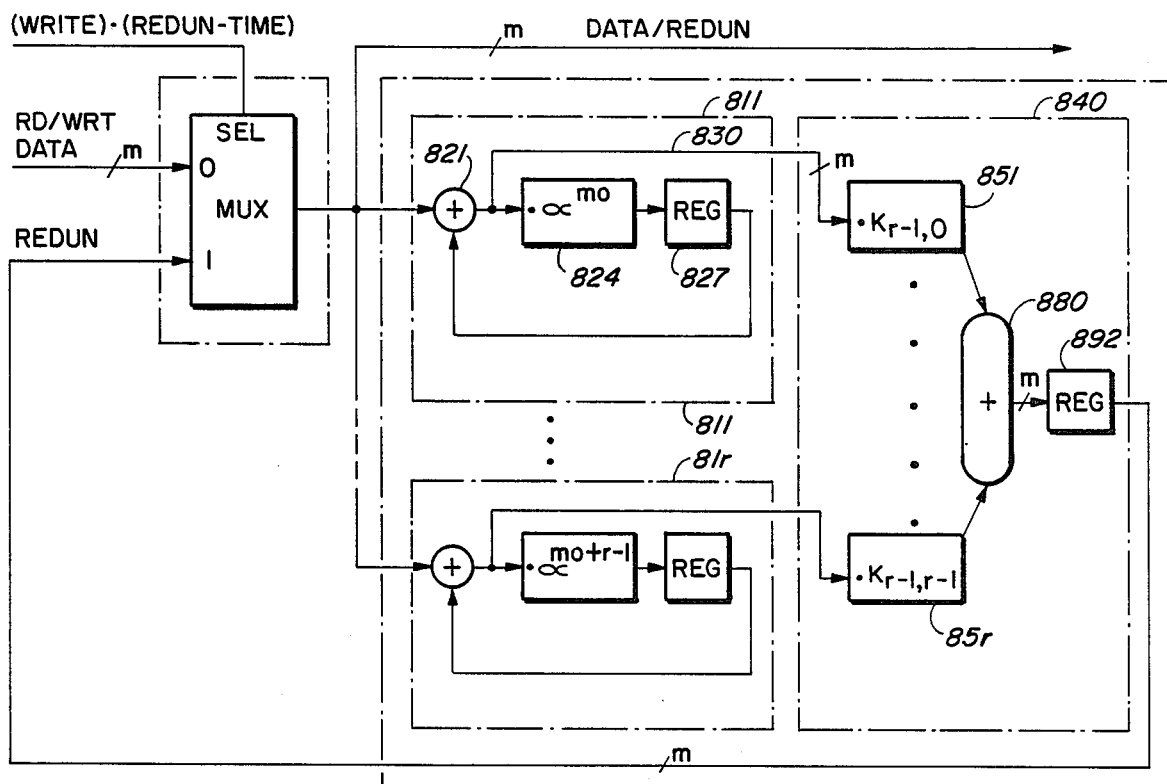
Figure 9:
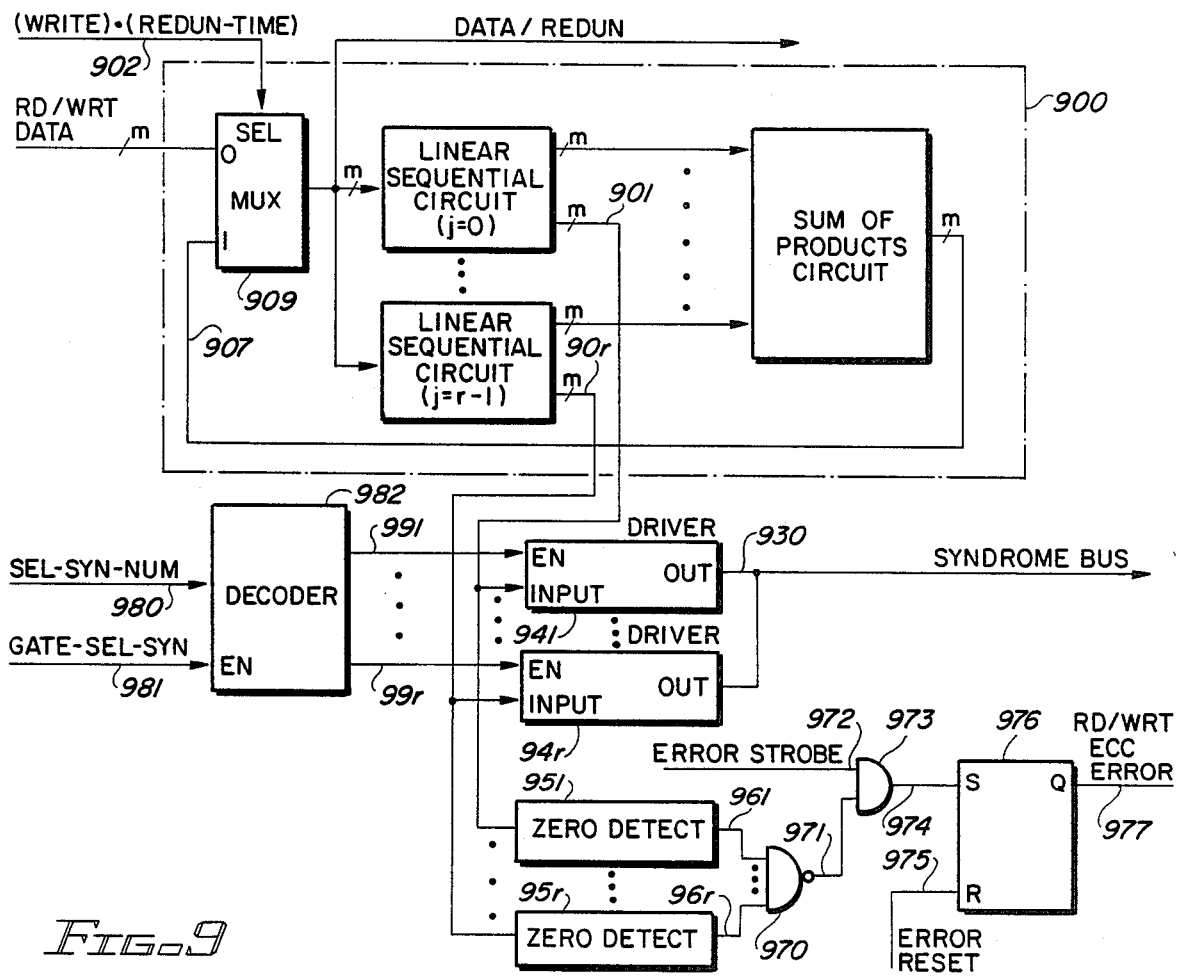
FIG. 9 shows an encoder and modified frequency-domain syndrome generator circuit using shared circuitry and incorporating error detection.

An encoder and modified frequency-domain syndrome generator circuit incorporating error detection is shown in FIG. 9. Circuit 900 represents the circuit of any of FIGS. 3, 4, 5, 6, 7, or 8. Outputs 901 through 90r are connected to the outputs of the registers of the Linear Sequential Circuits. Before a read or write operation, ERROR_RESET signal 975 resets RS latch 976, assuring that RD/WRT_ECC_ERROR signal 977 is not asserted. During a write operation, circuit 900 produces write redundancy. After circuit 900 has generated all r write redundancy symbols, the registers of each of its Linear Sequential Circuits should contain zero. Outputs 901 through 90r of the registers of the Linear Sequential Circuits of Circuit 900 are fed to zero-detection circuits 951 through 95r, whose outputs 961 through 96r feed r-input NAND gate 970. If any of the signals 961 through 96r is not equal to zero, output 971 of r-input NAND gate 970 is asserted. ERROR_STROBE signal 972 is pulsed after circuit 900 has generated all write redundancy symbols. If signal 971 is asserted when ERROR_STROBE signal 972 is pulsed, AND gate 973 asserts its output signal 974, setting RS latch 976, which asserts its output signal RD/WRT_ECC_ERROR signal 977 to flag a hardware failure during the write operation.

During a read operation, circuit 900 produces frequency-domain syndromes or modified frequency-domain syndromes, depending on which of FIG. 3, 4, 5, 6, 7, or 8 is implemented. After circuit 900 has processed all received data and redundancy symbols, the registers of each of its Linear Sequential Circuits contain zero if there was no error in the received codeword, otherwise at least one on the registers contains a non-zero value. Operating as described above for a write operation, zero-detection circuits 951 through 95r, NAND gate 970, AND gate 973 act to set RS latch 976 if any of the registers of the Linear Sequential Circuits of circuit 900 are non-zero when ERROR_STROBE signal 972 is pulsed. RD/WRT_ECC_ERROR signal 977 is then asserted to flag the existence of error(s) in the received codeword. Frequency-domain syndromes are transferred out of the circuit on SYNDROME bus 930 as follows: SEL_SYN_NUM signal 980 is controlled by a microprocessor and inputs the number of a syndrome to be placed on the SYNDROME bus. When GATE_SEL_SYN signal 981 is asserted, decoder 982 enables one of its output signals 991 through 99r, which are connected to the enable inputs (EN) of drivers 941 through 94r. The selected driver passes its INPUT bus (one of the frequency-domain syndrome or modified frequency-domain syndrome from one of the buses 901 through 90r) to SYNDROME bus 930. Another read operation cannot be initiated until the frequency-domain syndromes generated during the prior read operation have been transferred out of the circuit.

Figure 10B:
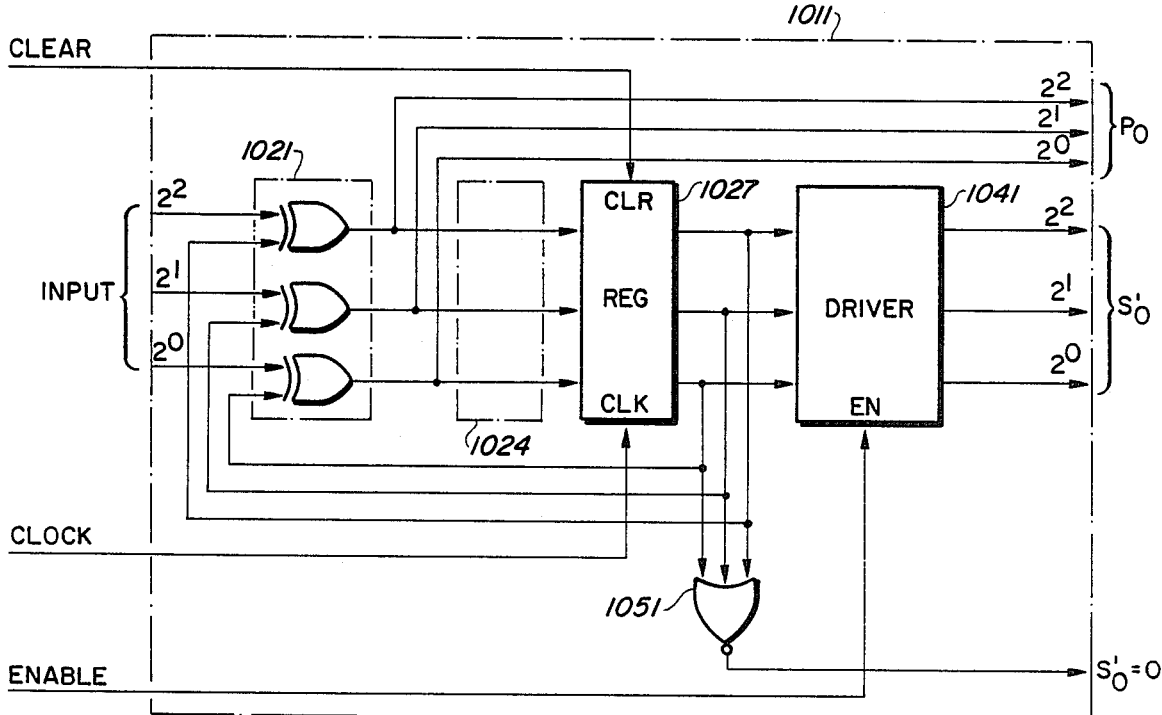
FIGS. 10A, 10B, 10C, 10D, and 10E show a detailed schematic diagram of an encoder and modified frequency-domain generating circuit implementing the circuits of FIG. 9 and FIG. 8 for m=3, r=3, a field generator polynomial $x^3 \oplus x^1 \oplus 1$, and $G(x) = x^3 \oplus \alpha^5 * x^2 \oplus \alpha^6 * x \oplus \alpha^3$.
Figure 10A:
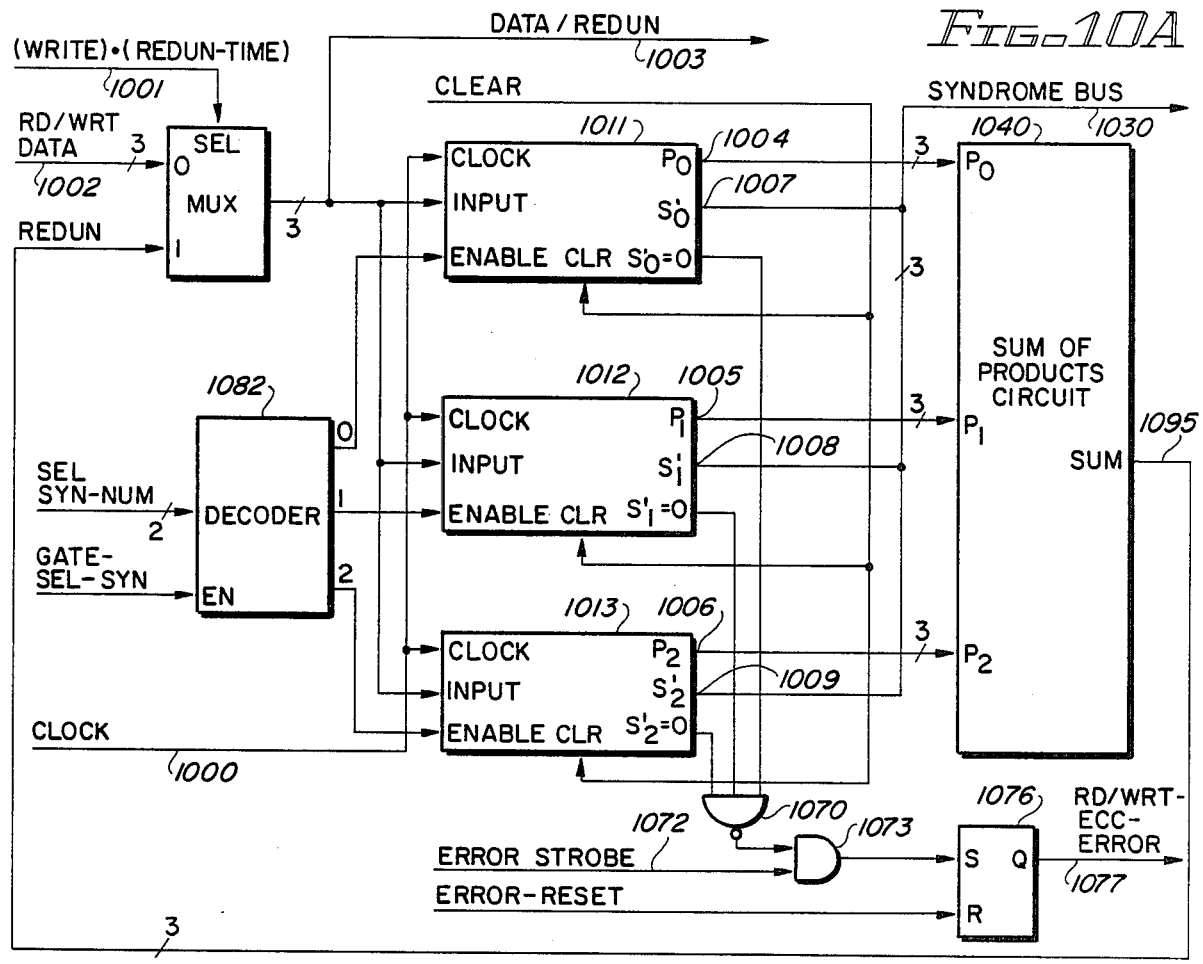
Figure 10C:
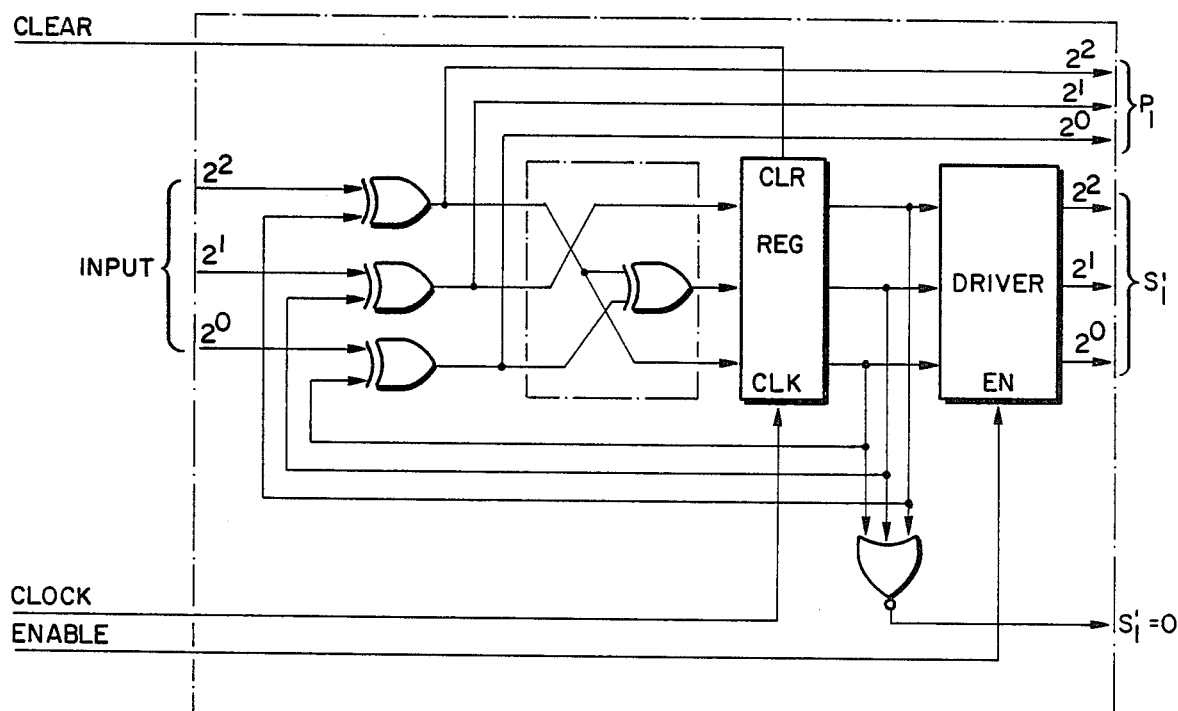
Figure 10D:
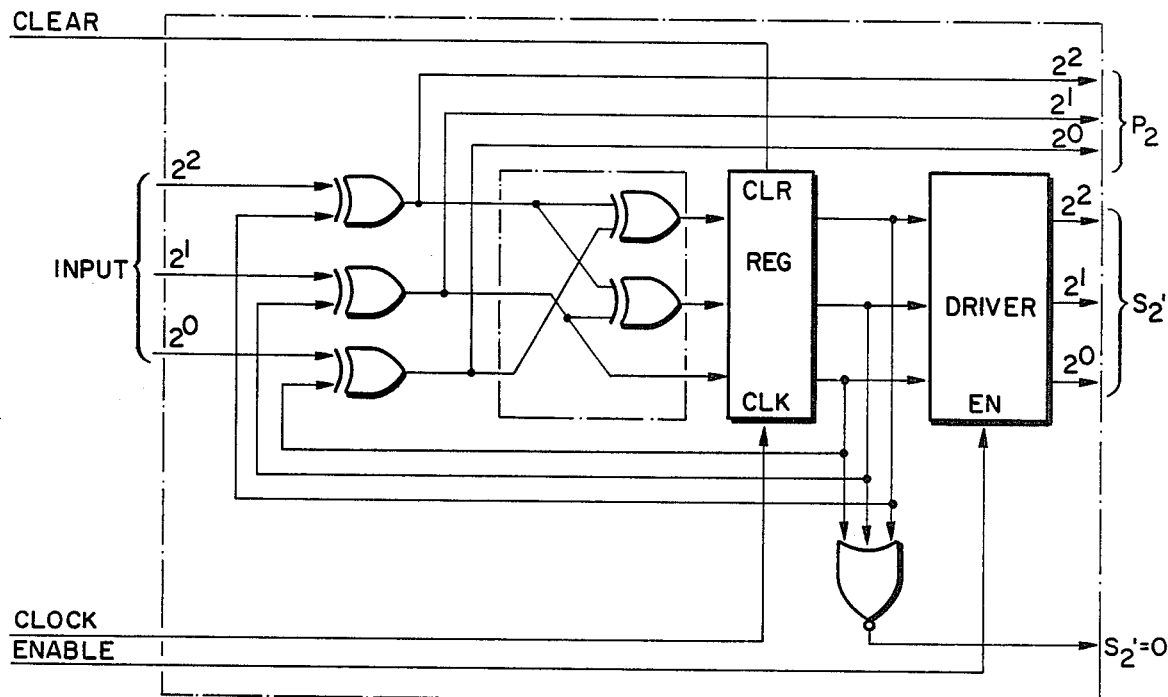
Figure 10E:
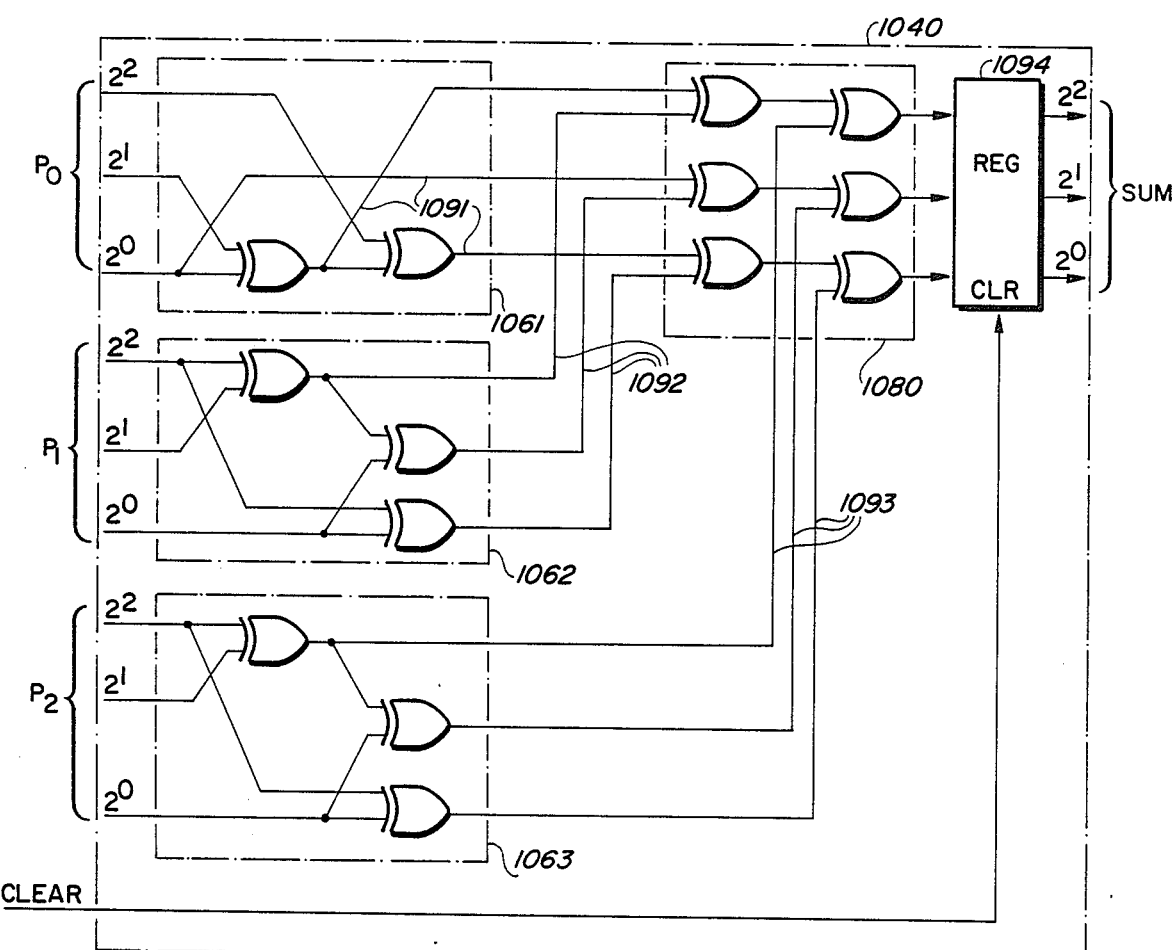

FIGS. 10A, 10B, 10C, 10D, and 10E show a detailed schematic diagram of an encoder and modified frequency-domain generating circuit for m=3 and r=3, a field generator polynomial $x^3 \oplus x^1 \oplus 1$, $G(x)=x^3 \oplus \alpha^5 * x^2 \oplus \alpha^6 * x \oplus \alpha^3$ and $c_j = \alpha^j$ for $0 \leq j < 4$ using the circuit of FIG. 9 and implementing Linear Sequential Circuits and a Sum of Products Circuit using the circuit of FIG. 8. Referring to FIG. 10B showing circuit 1011 of FIG. 10A, the three binary EXCLUSIVE-OR gates of circuit 1021, circuit 1024, and three-bit register 1027 perform the functions of EXCLUSIVE-OR summing circuit 821, finite-field multiplying circuit 824, and register 827 of circuit 811 of FIG. 8. Likewise, three-bit bus driver 1041 and three-input NOR gate 1051 perform the functions of driver 941 and zero-detection circuit 951 of FIG. 9. Referring to FIG. 10A, three-input NAND gate 1070, AND gate 1073, RS latch 1076, and decoder 1082 perform the functions of the corresponding elements 970, 973, 976, and 982 of FIG. 9. Referring to FIG. 10E showing circuit 1040 of FIG. 10A, finite-field constant multiplication circuits 1061, 1062, and 1063, EXCLUSIVE-OR summing circuit 1080, and three-bit register 1094 perform the functions of circuits 851 through 85r, 880, and 892 of circuit 840 of FIG. 8.

Figures 11, 12, 13:
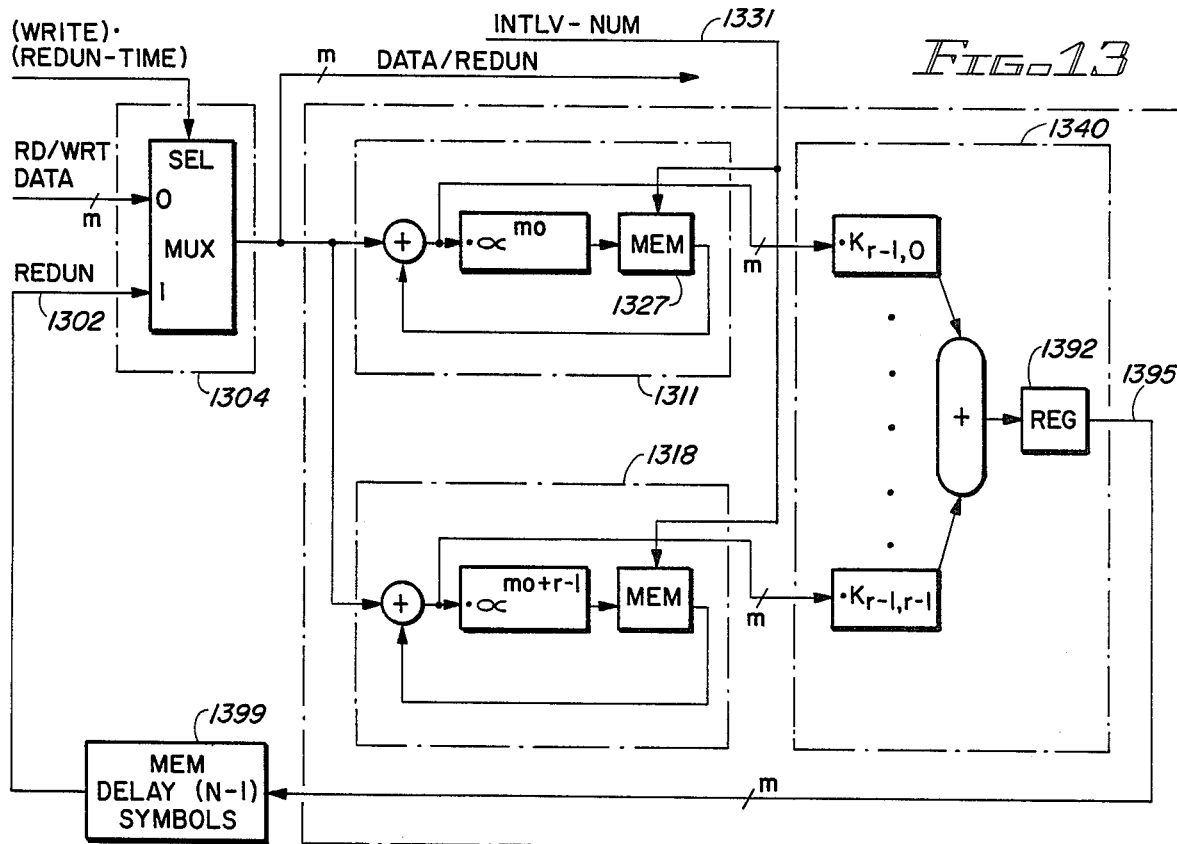
FIG. 11 shows a trace of the operation of the circuit of FIGS. 10A, 10B, 10C, 10D, and 10E, during a write operation.
FIG. 12 shows a trace of the operation of the circuit of FIGS. 10A, 10B, 10C, 10D, and 10E during a read operation.
FIG. 13 shows the circuit of FIG. 8 incorporating memory circuits for interleaving of codewords.

A trace of the operation of the circuit of FIGS. 10A, 10B, 10C, 10D, and 10E during a write operation is shown in FIG. 11; the column heading numbers and abbrieviated signal names correspond to the signal numbers and names of these figures. Note that the data polynomial $I(x)=1$ gives the correct write redundancy polynomial $W(x)=x^3*I(x)$ MOD $G(x)=x^3$ MOD $x^3 \oplus \alpha^5 * x^2 \oplus \alpha^6 x \oplus \alpha^3 = \alpha^5 * x^2 \oplus \alpha^6 x \oplus \alpha^3 = 7*x^2 \oplus 5x \oplus 3$ in the last three positions of the column labeled D_R.

FIG. 12 shows a trace of the operation of the circuit of FIGS. 10A, 10B, 10C, 10D, and 10E during a read operation; the column heading numbers and abbrieviated signal names correspond to the signal numbers and names of these figures. Note that the single error E=1 at location L=3 gives the correct modified frequency-domain syndromes $S_0' = E*\alpha^{0*(L+1)} = 1$, $S_1' = E*\alpha^{1*(L+1)} = \alpha^4 = 6$, and $S_2' = E*\alpha^{2*(L+1)} = \alpha^1 = 2$ in the corresponding positions of last row.

Interleaved codewords may be supported by replacing the registers in the Linear Sequential Circuits of FIGS. 3, 4, 5, 6, 7, and 8 with memory circuits for storing the parameters during write, and frequency-domain syndromes during read, of all codewords and by adding an interleave selection signal and decoding logic for selecting the variables associated with a particular codeword during the times that symbols from that codeword are being processed. Additionally, a delay in the feedback path from the output of the Sum Of Products circuit and the multiplexer (e.g. buses 395 and 302 of FIG. 3) equal in symbol-length clocking periods to the number of interleaves minus one is required. A circuit incorporating these features into the circuit of FIG. 8 is shown in FIG. 13. Referring to circuit 1311, symbol-wide by n-symbol (m bits by n symbol) memory circuit 1327, where n is the number of interleaved codewords, replaces register 827 of circuit 811 of FIG. 8. Memory circuit 1327 could comprise a register file or Random Access Memory (RAM) circuit. If memory circuit 1327 comprises a RAM circuit, it must have latched outputs or output latches must be added externally. The registers of the remaining Linear Sequential Circuits of circuits 1311 through 131r are replaced with memory circuits similar to those used in circuit 1311. INTLV_NUM signal 1331 applied to these memory circuits selects the values of the variables associated with the interleave being processed. There is one clock cycle per data and redundancy symbol. Memory circuit 1327 is read during the first half of the clock cycle and written during the second half of the cycle. INTLV_NUM signal 1331 is changed at the trailing edge of the clock cycle, after memory circuit 1327 is written. Register 1392 of Sum Of Products Circuit 1340 is clocked at the same edge that initiates the writing of the memory circuits of Linear Sequential Circuits 1311 thorugh 131r. Symbol-wide by n−1 symbol (m bits by n−1 symbol) memory circuit 1399 is inserted between output 1395 of Sum Of Products Circuit 1340 and input 1302 of multiplexer 1304. Memory circuit 1399 could consist of cascaded registers, a register file or a RAM circuit. If cascaded registers are used for memory circuit 1399, they are clocked at the same time that register 1392 of circuit 1340 is clocked. The rest of the circuit of FIG. 13 operates identically to the circuit of FIG. 8.

Finite-field multiplication of a variable field element by a constant field element using a $2^m$ by m-bit Read Only Memory (ROM) circuit such as that of FIG. 14 is known in the art. The $2^m$, m-bit products of a constant c and all elements of the field are stored in Read Only Memory circuit 1410. The m bits of variable element x are applied to m address input lines 1400. The finite-field product y of constant element c and variable element x is presented on m output lines 1420. When implementing constant finite-field multiplication with ROM circuits such as shown in FIG. 14, a circuit of FIG. 3, 4, 5, 6, 7, or 8 requires one such ROM circuit for each of the r Linear Sequential Circuits and r such ROM circuits for the Sum Of Products Circuit, for a total of 2r of these $2^m$ by m-bit ROM circuits for the circuit of any of FIG. 3, 4, 5, 6, 7, or 8.

The number of ROM circuits required may be reduced by using the circuit of FIG. 15, an extension of the circuit of FIG. 14. Here a single $r*2^m$ by m-bit ROM circuit 1510 is used in a time-multiplexed fashion to replace a set of r of the $2^m$ by m-bit ROM circuits used in a circuit of FIG. 3, 4, 5, 6, 7, or 8 when implementing constant finite-field multiplication with ROM circuits like those of FIG. 14 in circuits 1311 through 131r or in circuit 1340 of FIG. 13. The $r*2^m$, m-bit products of r constants $c_j$ (e.g. $\alpha^{m0+j}$ or $K_{r-1,j}$ for $0 \leq j < r$) and all elements of the field are stored in Read Only Memory circuit 1510. Hereafter, $\log_2 (r)$ means the smallest integer that is equal to or greater than the base two logarithm of r. A selection signal is applied to $\log_2 (r)$ address input lines 1540 of ROM circuit 1510 to select which of the r constants $c_j$ by which to multiply a variable element x. The m bits of variable element x are applied to m other address input lines 1500 of ROM circuit 1510. The finite-field product $y_j$ of selected constant element $c_j$ and variable element x is presented on m output lines 1520.

Often higher operating speeds can be attained using ROM circuits with fewer address input lines. In the circuit of FIG. 16, a pair of $r*2^{m/2}$ by m-bit ROM circuits 1610 and 1611 is used in place of the single $r*2^m$ by m-bit ROM circuit 1510 of FIG. 15. The $r*2^{m/2}$, m-bit products of a set of r constants $c_j$ (e.g. $\alpha^{m0+j}$ or $K_{r-1,j}$ for $0 \leq j < r$) and the $2^{m/2}$ field elements with all m/2 high-order bits equal to zero are stored in Read Only Memory circuit 1610. The $r*2^{m/2}$, m-bit products of the same r constants and the $2^{m/2}$ field elements with all m/2 low-order bits equal to zero are stored in Read Only Memory circuit 1611. A selection signal is applied to $\log_2 (r)$ address input lines 1606 of ROM circuit 1610 and $\log_2 (r)$ address input lines 1607 of ROM circuit 1611 to select which of the r constants $c_j$ by which to multiply a variable element x. The m/2 low-order bits of variable element x are applied to m/2 other address input lines 1608 of ROM circuit 1610 and the m/2 high-order bits of variable element x are applied to m/2 other input lines 1609 of ROM circuit 1611. Output 1612 of ROM circuit 1610 and output 1613 of ROM circuit 1611 are fed to EXCLUSIVE-OR summing circuit 1615, whose output 1620 is the finite-field product $y_j$ of the selected constant element $c_j$ and variable element x according to $Y_j = c_j * x$, $y_j = c_j*(x_7*\alpha^7 \oplus \ldots \oplus x_4*\alpha^4 \oplus x_3*\alpha^3 \oplus \ldots \oplus x_0*\alpha^0)$, $y_j = c_j*(x_7*\alpha^7 \oplus \ldots \oplus x_4*\alpha^4) \oplus c_j*(x_3*\alpha^3 \oplus \ldots \oplus x_0*\alpha^0)$.

The contents of such a pair of ROM circuits for m=4, r=4, a field generator polynomial $x^4 \oplus x^1 \oplus 1$, $G(x) = x^4 \oplus \alpha^{15}*x^3 \oplus \alpha^3*x^2 \oplus *x \oplus \alpha^{12}$ and $c_j = \alpha^j$ for $0 \leq j < 4$ are shown in FIG. 17 in hexadecimal form.

It is to be understood in the foregoing discussion that ROM circuits could be replaced with RAM circuits whose contents are initialized at power-up time.

Using a single time-multiplexed multiplier circuit to replace a set of Linear Sequential Circuits such as 311 through 31r of FIG. 3 requires some means for fetching the variable multiplicand and storing the product associated with each parameter or (modified) frequency-domain syndrome. This could consist of any kind of memory circuits, including a register file connected to an address decoder operating off an r time slot selection signal, or RAM circuits. The memory circuits of FIG. 13 can be expanded to comprise m bit by r*n symbol memory circuits with additional inputs for selecting the variable associated with the desired parameter or (modified) frequency-domain syndrome. Referring to FIG. 18, a single time-multiplexed Linear Sequential Circuit 1800 performs the function of Linear Sequential Circuits 811–81r of FIG. 8. The data and redundancy symbols are fed to EXCLUSIVE-OR summing circuit 1821 on bus 1805. During each time slot j, time-multiplexed multiplying circuit 1824 outputs on bus 1825 the product of its input 1822 and the constant $\alpha^{m0+j}$ selected by selection circuit 1806 as described above. Selection signal 1806 is also connected to memory circuit 1827 and it selects the variable to be outputted from memory circuit 1827 and fed to the other input of EXCLUSIVE-OR summing circuit 1821 during the first half of each time slot and written into memory circuit 1827 during the second half of each time slot. At the end of each time slot j, output 1830 of the circuit of FIG. 18 is identical to the output produced by Linear Sequential Circuit 81j of FIG. 8.

FIG. 19 shows a circuit for using a time-multiplexed multiplier in a Sum Of Products Circuit. Time-multiplexed multiplier circuit 1900 performs the function of the r finite-field multiplying circuits 351–35r in circuit 340 of FIG. 3. Two-symbol-input EXCLUSIVE-OR summing circuit 1943 and registers 1945 and 1947 replace the r symbol-input EXCLUSIVE-OR summing circuit 380 in circuit 340 of FIG. 3. Register 1945 is initialized to zero at the beginning of each set of r time slots by signal 1948. During each time slot j of selection signal 1941, parameter $P_j$ is fed to circuit 1900 on bus 1930. Circuit 1900 forms the product of $P_j$ and $K_{r-1,j}$ as described above and passes the result to input 1942 of EXCLUSIVE-OR summing circuit 1943. The output 1944 of EXCLUSIVE-OR summing circuit 1943 is stored in register 1945 at the end of each time slot j of selection signal 1941. Output 1946 of register 1945 is connected to the other input of EXCLUSIVE-OR summing circuit 1943. At the end of the last time slot of each set of r time slots, output 1944 of EXCLUSIVE-OR summing circuit 1943 is the desired sum of products and is stored in register 1947. Output 1995 of the circuit of FIG. 19 is available during the next set of r time slots.

Figure 20:
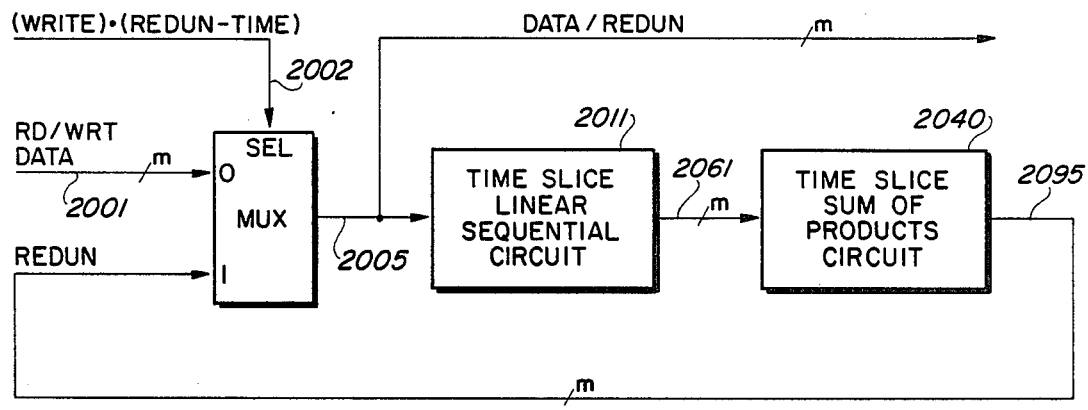
FIG. 20 shows a general encoder and modified frequency-domain syndrome generator circuit using shared circuitry and implementing time-multiplexing techniques.

An encoder and modified frequency-domain syndrome generator circuit using time-multiplexing techniques can be constructed as shown in FIG. 20. The r Linear Sequential Circuits of FIGS. 3, 4, 5, 6, 7, or 8, are replaced with one time-multiplexed Linear Sequential Circuit 2011 and the r-input Sum Of Products Circuit is replaced with a single one-input time-multiplexed Sum Of Products Circuit 2040. The single clock cycle per data and redundancy byte of FIGS. 3, 4, 5, 6, 7, and 8 is subdivided into r time slots as in FIGS. 18 and 19.

Figure 21:
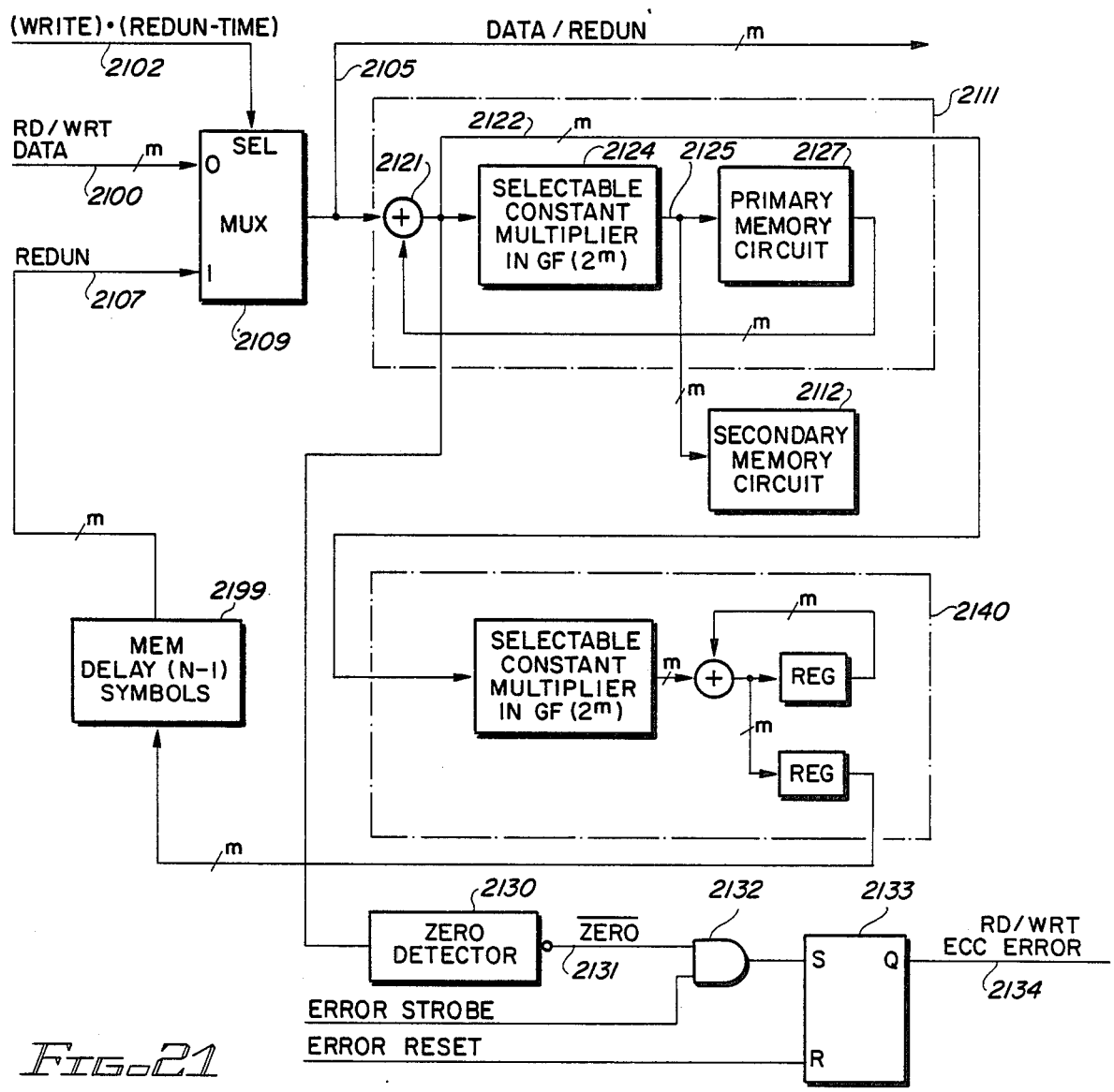
FIG. 21 shows a detailed diagram of an encoder and modified frequency-domain syndrome generator circuit using shared circuitry and implementing time-multiplexing techniques and incorporating sequential error detection and secondary memory elements.

There are many ways to retrieve syndromes from such a circuit. One such way is shown in FIG. 21. The RD/WRT_DATA bus, (WRITE)·(REDUN_TIME) signal, REDUN bus, and multiplexer 2109 operate identically to the corresponding elements of FIG. 9. Time-multiplexed Linear Sequential Circuit 21011 operates as described for the circuit of FIG. 18. Time-multiplexed Sum Of Products Circuit 2140 operates as described for the circuit of FIG. 19. Interleaved codewords are supported using memory circuit 2199 as described for the circuit of FIG. 13. A secondary memory circuit 2112 records the modified syndromes produced by time-multiplexed Linear Sequential Circuit 2111 at output 2125 of time-multiplexed multiplying circuit 2124 during the processing of the last received redundancy symbol. When error(s) in the received set of interleaved codewords are detected, processing of the next received set of interleaved codewords using the primary memory circuit 2127 can begin while a microprocessor retrieves the modified frequency-domain syndromes from secondary memory circuit.

Single zero-detection circuit 2130 and the ERRor_STROBE signal are used in a time-multiplexed fashion to detect if the output 2122 of EXCLUSIVE-OR summing circuit 2121 is zero during each of the r time slots during the processing of the last redundancy byte. ERROR_STOBE is pulsed once per time slot during the period when the output 2125 of time-multiplexed multiplier 2124 is being recorded in secondary memory circuit 2112 at a time when the output 2131 of zero-detection circuit 2130 is valid. If signal 2131 is asserted when ERROR_STROBE is pulsed, AND gate 2132 asserts its output, setting RS latch 2133 to assert the RD/WRT_ECC_ERROR signal 2134 to flag a hardware failure during a write operation or the existence of error(s) in the received set of interleaved codewords during a read operation.

While the invention herein disclosed has been described by means of specific embodiments and applications thereof, numerous modifications and variations could be made thereto by those skilled in the art without departing from the spirit and scope of the present invention. It is therefore to be understood that within the scope of the appended claims, the invention may be practised otherwise than as specifically described herein.

What is claimed is:

1. In an error detection and correction system using a Reed-Solomon code for the detection and correction of a plurality of errors in a codeword C(x) comprising k data symbols and r check symbols wherein said k data symbols comprise coefficients $I_i$ of a data polynomial $$I(x) = \sum_{i=0}^{k-1} o\, I_i * x^i$$

and said r check symbols comprise coefficients $W_i$ of a write redundancy polynomial $$W(x) = \sum_{i=0}^{r-1} o\, W_i * x^i$$

and further wherein each said symbol comprises an element of a finite field $GF(2^m)$ comprised of m binary bits of information, and a code generator polynomial G(x) of said code having a degree r+1 is given by $$G(x) = \prod_{j=0}^{r-1} (x \oplus \alpha^{m0+j}),$$

wherein $m_0$ is a parameter of said code, an encoder and frequency-domain syndrome generator circuit comprising:

(a) means for computing
a plurality r of parameters $$P_j = I(x) MOD(x \oplus \alpha^{m0+j})$$

from said data polynomial I(x) wherein j varies from 0 to r−1 and each of said plurality r of parameters $P_j$ is updated with a coefficient $I_i$ of said data polynomial I(x) according to $$P_j = \alpha^{m0+j} * P_j \oplus I_i,$$

a plurality of modified parameters $$P_j' = \alpha^{m0+j} * P_j,$$

a plurality r of frequency-domain syndromes $$S_j = C'(x) MOD(x \oplus \alpha^{m0+j})$$

from a received codeword C'(x), wherein j varies from 0 to r−1 and each of said plurality r of frequency-domain syndromes $S_j$ is updated with a coefficient $C_i'$ of said received codeword C'(x) according to $$S_j = \alpha^{m0+j} * S_j \oplus C_i',$$

and a plurality of modified frequency-domain syndromes $$S_j' = \alpha^{m0+j} * S_j,$$

(b) means for computing a plurality r of coefficients $W_i$ of said write redundancy polynomial according to $$W_i = \sum_{j=0}^{r-1} o\, K_{r-1,j} * P_j,$$

wherein constants $K_{r-1,j}$ are obtained by solution of a system of equations $$P_j = \sum_{i=0}^{r-1} o\, \alpha^{(i-r)(m0+j)} * W_i, \text{ and}$$

(c) means for updating each of said plurality r of parameters $P_j$ with each of said coefficients $W_i$ according to $$P_j = \alpha^{m0+j} * P_j \oplus W_i,$$

and for updating each of said plurality r of modified parameters $R_j'$ with each of said coefficients $W_i$ according to $$P_j' = \alpha^{m0+j} * (\alpha^{m0+j} * P_j \oplus W_i).$$

2. The encoder and frequency-domain syndrome generator circuit of claim 1 wherein said means for computing said plurality r of parameters $P_j$ and said plurality r of frequency-domain syndromes $S_j$ comprises a plurality r of Linear Sequential Circuit means, each said Linear Sequential Circuit means comprising
   (a) EXCLUSIVE-OR summing circuit means;
   (b) storage means for storing one of said plurality r of parameters $P_j$ and one of said plurality r of frequency-domain syndromes $S_j$;
   (c) finite-field constant multiplication means;
   means for connecting a first input of said EXCLUSIVE-OR summing circuit means (a) to said data polynomial coefficients $I_i$ and said received codeword polynomial coefficients $C_i'$ and said write redundancy coefficients $W_i$;
   means for connecting an output of said EXCLUSIVE-OR summing circuit means (a) to an input of said storage means (b);
   means for connecting an output of said storage means (b) to an input of said finite-field constant multiplication means (c);
   means for connecting an output of said finite-field constant multiplication means (c) to a second input of said EXCLUSIVE-OR summing circuit means (a); and
   means for connecting an output of said Linear Sequential Circuit means to said output of said storage means (b); and
further wherein said means for computing said coefficient $W_i$ comprises Sum Of Products means comprising
   (d) a plurality r of finite-field constant multiplication means;
   (e) EXCLUSIVE-OR summing circuit means having a plurality r of inputs;
   means for connecting an input of each of said finite-field constant multiplication means (d) to one of said outputs of said Linear Sequential Circuit means; and
   means for connecting an output of each of said finite-field constant multiplication means (d) to an input of said EXCLUSIVE-OR summing circuit means (e); and
   means for connecting an output of said Sum Of Products means to said output of said EXCLUSIVE-OR summing circuit means (e).

3. The encoder and frequency-domain syndrome generator circuit of claim 1 wherein said means for computing said plurality r of parameters $P_j$ and said plurality r of frequency-domain syndromes $S_j$ comprises a plurality r of Linear Sequential Circuit means, each said Linear Sequential Circuit means comprising
   (a) EXCLUSIVE-OR summing circuit means;
   (b) storage means for storing one of said plurality r of parameters $P_j$ and one of said plurality r of frequency-domain syndromes $S_j$;
   (c) finite-field constant multiplication means;
   means for connecting a first input of said EXCLUSIVE-OR summing circuit means (a) to said data polynomial coefficients $I_i$ and said received codeword polynomial coefficients $C_i'$ and said write redundancy coefficients $W_i$;
   means for connecting an output of said EXCLUSIVE-OR summing circuit means (a) to an input of said storage means (b);
   means for connecting an output of said storage means (b) to an input of said finite-field constant multiplication means (c);
   means for connecting an output of said finite-field constant multiplication means (c) to a second input of said EXCLUSIVE-OR summing circuit means (a); and
   means for connecting an output of said Linear Sequential Circuit means to said output of said EXCLUSIVE-OR summing means (a); and
further wherein said means for computing said coefficient $W_i$ comprises Sum Of Products means comprising
   (d) a plurality r of finite-field constant multiplication means;
   (e) EXCLUSIVE-OR summing circuit means having a plurality r of inputs;
   (f) storage means;
   means for connecting an input of each of said finite-field constant multiplication means (d) to one of said outputs of said Linear Sequential Circuit means;
   means for connecting an output of each of said finite-field constant multiplication means (d) to an input of said EXCLUSIVE-OR summing circuit means (e);
   means for connecting an output of said EXCLUSIVE-OR summing circuit means (e) to an input of said storage means (f); and
   means for connecting an output of said Sum Of Products means to said output of said storage means (f).

4. The encoder and frequency-domain syndrome generator circuit of claim 1 wherein said means for computing said plurality r of parameters $P_j'$ and said plurality r of frequency-domain syndromes $S_j'$ comprises a plurality r of Linear Sequential Circuit means, each said Linear Sequential Circuit means comprising
   (a) EXCLUSIVE-OR summing circuit means;
   (b) finite-field constant multiplication means;
   (c) storage means for storing one of said plurality r of modified parameters $P_j'$ and one of said plurality r of modified frequency-domain syndromes $S_j'$;
   means for connecting a first input of said EXCLUSIVE-OR summing circuit means (a) to said data polynomial coefficients $I_i$ and said received codeword polynomial coefficients $C_i'$ and said write redundancy coefficients $W_i$;
   means for connecting an output of said EXCLUSIVE-OR summing circuit means (a) to an input of said finite-field constant multiplication means (b);
   means for connecting an output of said finite-field constant multiplication means (b) to an input of said storage means (c);
   means for connecting an output of said storage means (c) to a second input of said EXCLUSIVE-OR summing circuit means (a); and
   means for connecting an output of said Linear Sequential Circuit means to said output of said EXCLUSIVE-OR summing circuit means (a); and
further wherein said means for computing said coefficient $W_i$ comprises Sum Of Products means comprising
   (d) a plurality r of finite-field constant multiplication means;
   (e) EXCLUSIVE-OR summing circuit means having a plurality r of inputs;
   (f) storage means;
   means for connecting an input of each of said finite-field constant multiplication means (d) to one of said outputs of said Linear Sequential Circuit means;
   means for connecting an output of each of said finite-field constant multiplication means (d) to an input of said EXCLUSIVE-OR summing circuit means (e);

means for connecting an output of said EXCLUSIVE-OR summing circuit means (e) to an input of said storage means (f); and means for connecting an output of said Sum Of Products means to said output of said storage means (f).

5. The encoder and frequency-domain syndrome generator circuit of claim 1 wherein said means for computing said plurality r of parameters $P_j$ and said plurality r of frequency-domain syndromes $S_j$ comprises time-multiplexed Linear Sequential Circuit means comprising (a) EXCLUSIVE-OR summing circuit means;

(b) storage means for storing said plurality r of parameters $P_j$ and said plurality r of frequency-domain syndromes $S_j$;

(c) selectable finite-field constant multiplication means;

(d) selection means for selecting one of said selectable finite-field constants;

means for connecting a first input of said EXCLUSIVE-OR summing circuit means (a) to said data polynomial coefficients $I_i$ and said received codeword polynomial coefficients $C_i'$ and said write redundancy coefficients $W_i$;

means for connecting an output of said EXCLUSIVE-OR summing circuit means (a) to an input of said storage means (b);

means for connecting an output of said storage means (b) to an input of said selectable finite-field constant multiplication means (c);

means for connecting an output of said selectable finite-field constant multiplication means (c) to a second input of said EXCLUSIVE-OR summing circuit means (a); and means for connecting an output of said time-multiplexed Linear Sequential Circuit means to said output of said storage means (b); and further wherein said means for computing said coefficient $W_i$ comprises time-multiplexed Sum Of Products means comprising (e) selectable finite-field constant multiplication means;

(f) EXCLUSIVE-OR summing circuit means;

(g) first storage means;

(h) second storage means;

means for connecting an input of said selectable finite-field constant multiplication means (e) to said output of said time-multiplexed Linear Sequential Circuit means;

means for connecting an output of said selectable finite-field constant multiplication means (e) to a first input of said EXCLUSIVE-OR summing circuit means (f);

means for connecting an output of said EXCLUSIVE-OR summing circuit means (f) to an input of said first storage means (g);

means for connecting an output of said EXCLUSIVE-OR summing circuit means (f) to an input of said second storage means (h);

means for connecting an output of said first storage means (g) to a second input of said EXCLUSIVE-OR summing circuit means (f); and means for connecting an output of said time-multiplexed Sum Of Products means to an output of said second storage means (h).

6. The encoder and frequency-domain syndrome generator circuit of claim 1 wherein said means for computing said plurality r of parameters $P_j$ and said plurality r of frequency-domain syndromes $S_j$ comprises time-multiplexed Linear Sequential Circuit means comprising (a) EXCLUSIVE-OR summing circuit means;

(b) storage means for storing said plurality r of parameters $P_j$ and said plurality r of frequency-domain syndromes $S_j$;

(c) selectable finite-field constant multiplication means;

(d) selection means for selecting one of said selectable finite-field constants;

means for connecting a first input of said EXCLUSIVE-OR summing circuit means (a) to said data polynomial coefficients $I_i$ and said received codeword polynomial coefficients $C_i'$ and said write redundancy coefficients $W_i$;

means for connecting an output of said EXCLUSIVE-OR summing circuit means (a) to an input of said storage means (b);

means for connecting an output of said storage means (b) to an input of said selectable finite-field constant multiplication means (c);

means for connecting an output of said selectable finite-field constant multiplication means (c) to a second input of said EXCLUSIVE-OR summing circuit means (a); and means for connecting an output of said time-multiplexed Linear Sequential Circuit means to said output of said EXCLUSIVE-OR summing circuit means (a); and further wherein said means for computing said coefficient $W_i$ comprises time-multiplexed Sum Of Products means comprising (e) selectable finite-field constant multiplication means;

(f) EXCLUSIVE-OR summing circuit means;

(g) first storage means;

(h) second storage means;

means for connecting an input of said selectable finite-field constant multiplication means (e) to said output of said time-multiplexed Linear Sequential Circuit means;

means for connecting an output of said selectable finite-field constant multiplication means (e) to a first input of said EXCLUSIVE-OR summing circuit means (f);

means for connecting an output of said EXCLUSIVE-OR summing circuit means (f) to an input of said first storage means (g);

means for connecting an output of said EXCLUSIVE-OR summing circuit means (f) to an input of said second storage means (h);

means for connecting an output of said first storage means (g) to a second input of said EXCLUSIVE-OR summing circuit means (f); and means for connecting an output of said time-multiplexed Sum Of Products means to an output of said second storage means (h).

7. The encoder and frequency-domain syndrome generator circuit of claim 1 wherein said means for computing said plurality r of parameters $P_j$ and said plurality r of frequency-domain syndromes $S_j$ comprises time-multiplexed Linear Sequential Circuit means comprising (a) EXCLUSIVE-OR summing circuit means;

(b) storage means for storing said plurality r of modified parameters $P_j'$ and said plurality r of modified frequency-domain syndromes $S_j'$;
(c) selectable finite-field constant multiplication means;
(d) selection means for selecting one said selectable finite-field constants;

means for connecting a first input of said EXCLUSIVE-OR summing circuit means (a) to said data polynomial coefficients $I_i$ and said received codeword polynomial coefficients $C_i'$ and said write redundancy coefficients $W_i$;

means for connecting an output of said EXCLUSIVE-OR summing circuit means (a) to an input of said selectable finite-field constant multiplication means (c);

means for connecting an output of said selectable finite-field constant multiplication means (c) to an input of said storage means (b);

means for connecting an output of said storage means (b) to a second input of said EXCLUSIVE-OR summing circuit means (a); and means for connecting an output of said Linear Sequential Circuit means to said output of said EXCLUSIVE-OR summing circuit means (a); and further wherein said means for computing said coefficient $W_i$ comprises time-multiplexed Sum Of Products means comprising (e) selectable finite-field constant multiplication means;
(f) EXCLUSIVE-OR summing circuit means;
(g) first storage means;
(h) second storage means;

means for connecting an input of said selectable finite-field constant multiplication means (e) to said output of said time-multiplexed Linear Sequential Circuit means;

means for connecting an output of said selectable finite-field constant multiplication means (e) to a first input of said EXCLUSIVE-OR summing circuit means (f);

means for connecting an output of said EXCLUSIVE-OR summing circuit means (f) to an input of said first storage means (g);

means for connecting an output of said EXCLUSIVE-OR summing circuit means (f) to an input of said second storage means (h);

means for connecting an output of said first storage means (g) to a second input of said EXCLUSIVE-OR summing circuit means (f); and means for connecting an output of said time-multiplexed Sum Of Products means to an output of said second storage means (h).

8. The encoder and frequency-domain syndrome generator circuit of claim 1 wherein each said binary bit of each of said plurality r of parameters $P_j$ before encoding, and each said binary bit of each of said plurality r of frequency-domain syndromes $s_j$ before frequency-domain syndrome generation, is initialized to one.

9. In the encoder and frequency-domain syndrome generator circuit of claim 1, means for interleaving a plurality n of codewords comprising means for storing said plurality r of parameters $P_j$ during encoding, and for storing said plurality r of frequency-domain syndromes $S_j$ during frequency-domain syndrome generation, of a plurality n-1 of said codewords during processing of symbols from another of said codewords.

10. In the encoder and frequency-domain syndrome generator circuit of claim 1, self-checking means comprising means for recording an indicium of error when any of said plurality r of parameters $P_j$ is not equal to zero after encoding is completed.

11. The encoder and frequency-domain syndrome generator circuit of claim 1 wherein said means for computing said plurality r of modified parameters $P_j'$ and said plurality r of modified frequency-domain syndromes $S_j'$ comprises a plurality r of Linear Sequential Circuit means, each said Linear Sequential Circuit means comprising (a) EXCLUSIVE-OR summing circuit means;
(b) finite-field constant multiplication means;
(c) storage means for storing one of said plurality r of modified parameters $P_j'$ and one of said plurality r of modified frequency-domain syndromes $S_j'$;

means for connecting a first input of said EXCLUSIVE-OR summing circuit means (a) to said data polynomial coefficients $I_i$ and said received codeword polynomial coefficients $C_i'$ and said write redundancy coefficients $W_i$;

means for connecting an output of said EXCLUSIVE-OR summing circuit means (a) to an input of finite-field constant multiplication means (b);

means for connecting an output of said finite-field constant multiplication means (b) to an input of said storage means (c);

means for connecting an output of said storage means (c) to a second input of said EXCLUSIVE-OR summing circuit means (a); and means for connecting an output of said Linear Sequential Circuit means to said output of said storage means (b); and further wherein said means for computing said coefficient $W_i$ comprises Sum Of Products means comprising (d) a plurality r of finite-field constant multiplication means;
(e) EXCLUSIVE-OR summing circuit means having a plurality r of inputs;

means for connecting an input of each of said finite-field constant multiplication means (d) to one of said outputs of said Linear Sequential Circuit means; and means for connecting an output of each of said finite-field constant multiplication means (d) to an input of said EXCLUSIVE-OR summing circuit means (e); and means for connecting an output of said Sum Of Products means to an output of said EXCLUSIVE-OR summing circuit means (e).

12. The encoder and frequency-domain syndrome generator circuit of claim 1 wherein said means for computing said plurality r of modified parameters $P_j'$ and said plurality r of modified frequency-domain syndromes $S_j'$ comprises a plurality r of Linear Sequential Circuit means, each said Linear Sequential Circuit means comprising (a) EXCLUSIVE-OR summing circuit means;
(b) finite-field constant multiplication means;
(c) storage means for storing one of said plurality r of modified parameters $P_j'$ and one of said plurality r of modified frequency-domain syndromes $S_j'$;

means for connecting a first input of said EXCLUSIVE-OR summing circuit means (a) to said data polynomial coefficients $I_i$ and said received codeword polynomial coefficients $C_i'$ and said write redundancy coefficients $W_i$;

means for connecting an output of said EXCLUSIVE-OR summing circuit means (a) to an input of said finite-field constant multiplication means (b);

means for connecting an output of said finite-field constant multiplication means (b) to an input of said storage means (c);

means for connecting an output of said storage means (c) to a second input of said EXCLUSIVE-OR summing circuit means (a); and means for connecting an output of said Linear Sequential Circuit means to said output of said finite-field constant multiplication means (b); and further wherein said means for computing said coefficient $W_i$ comprises Sum Of Products means comprising (d) a plurality r of finite-field constant multiplication means;

(e) EXCLUSIVE-OR summing circuit means having a plurality r of inputs;

(f) storage means;

means for connecting an input of each of said finite-field constant multiplication means (d) to one of said outputs of said Linear Sequential Circuit means;

means for connecting an output of each of said finite-field constant multiplication means (d) to an input of said EXCLUSIVE-OR summing circuit means (e);

means for connecting an output of said EXCLUSIVE-OR summing circuit means (e) to an input of said storage means (f); and means for connecting an output of said EXCLUSIVE-OR summing circuit means (e) to an input of said storage means (f); and means for connecting an output of said Sum Of Products means to an output of said storage means (f).

13. The encoder and frequency-domain syndrome generator circuit of claim 1 wherein said means for computing said plurality r of parameters $P_j$ and said plurality r of frequency-domain syndromes $S_j$ comprises a plurality r of Linear Sequential Circuit means, each said Linear Sequential Circuit means comprising (a) EXCLUSIVE-OR summing circuit means;

(b) storage means for storing one of said plurality r of parameters $P_j$ and one of said plurality r of frequency-domain syndromes $S_j$;

(c) finite-field constant multiplication means;

means for connecting a first input of said EXCLUSIVE-OR summing circuit means (a) to said data polynomial coefficients $I_i$ and said received codeword polynomial coefficients $C_i'$ and said write redundancy coefficients $W_i$;

means for connecting an output of said EXCLUSIVE-OR summing circuit means (a) to an input of said storage means (b);

means for connecting an output of said storage means (b) to an input of said finite-field multiplication means (c);

means for connecting an output of said finite-field multiplication means means (c) to a second input of said EXCLUSIVE-OR summing circuit means (a); and means for connecting an output of said Linear Sequential Circuit means to said output of said finite-field multiplication means (c); and further wherein said means for computing said coefficient $W_i$ comprises Sum Of Products means comprising (d) a plurality r of finite-field constant multiplication means;

(e) EXCLUSIVE-OR summing circuit means having a plurality r of inputs;

means for connecting an input of each of said finite-field constant multiplication means (d) to one of said outputs of said Linear Sequential Circuit means;

means for connecting an output of each of said finite-field constant multiplication means (d) to an input of said EXCLUSIVE-OR summing circuit means (e);

means for connecting an output of said Sum Of Products means to said output of said EXCLUSIVE-OR summing circuit means (e).

14. The encoder and frequency-domain syndrome generator circuit of claim 1 wherein said means for computing said plurality r of modified parameters $P_j'$ and said plurality r of modified frequency-domain syndromes $S_j'$ comprises time-multiplexed Linear Sequential Circuit means comprising (a) EXCLUSIVE-OR summing circuit means;

(b) selectable finite-field constant multiplication means;

(c) storage means for storing said plurality r of modified parameters $P_j'$ and said plurality r of modified frequency-domain syndromes $S_j'$;

(d) selection means for selecting one of said selectable finite-field constants;

means for connecting a first input of said EXCLUSIVE-OR summing circuit means (a) to said data polynomial coefficients $I_i$ and said received codeword polynomial coefficients $C_i'$ and said write redundancy coefficients $W_i$;

means for connecting an output of said EXCLUSIVE-OR summing circuit means (a) to an input of said selectable finite-field constant multiplication means (b);

means for connecting an output of said selectable finite-field constant multiplication means (b) to an input of said storage means (c);

means for connecting an output of said storage means (c) to a second input of said EXCLUSIVE-OR summing circuit means (a); and means for connecting an output of said time-multiplexed Linear Sequential Circuit means to said output of said storage means (c); and further wherein said means for computing said coefficient $W_i$ comprises time-multiplexed Sum Of Products means comprising (e) selectable finite-field constant multiplication means;

(f) EXCLUSIVE-OR summing circuit means;

(g) first storage means;

(h) second storage means;

means for connecting an input of said selectable finite-field constant multiplication means (e) to said output of said time-multiplexed Linear Sequential Circuit means;

means for connecting an output of said selectable finite-field constant multiplication means (e) to a first input of said EXCLUSIVE-OR summing circuit means (f);

means for connecting an output of said EXCLUSIVE-OR summing circuit means (f) to an input of said first storage means (g);

means for connecting an output of said EXCLUSIVE-OR summing circuit means (f) to an input of said second storage means (h);

means for connecting an output of said first register means (g) to a second input of said EXCLUSIVE-OR summing circuit means (f); and means for connecting an output of said time-multiplexed Sum Of Products means to an output of said second storage means (h).

15. The encoder and frequency-domain syndrome generator circuit of claim 1 wherein said means for computing said plurality r of modified parameters $P_j'$ and said plurality r of modified frequency-domain syndromes $S_j'$ comprises time-multiplexed Linear Sequential Circuit means comprising (a) EXCLUSIVE-OR summing circuit means;
(b) selectable finite-field constant multiplication means;
(c) storage means for storing said plurality r of modified parameters $P_j'$ and said plurality r of modified frequency-domain syndromes $S_j'$;
(d) selection means for selecting one of said selectable finite-field constants;

means for connecting a first input of said EXCLUSIVE-OR summing circuit means (a) to said data polynomial coefficients $I_i$ and said received codeword polynomial coefficients $C_i'$ and said write redundancy coefficients $W_i$;

means for connecting an output of said EXCLUSIVE-OR summing circuit means (a) to an input of said selectable finite-field constant multiplication means (b);

means for connecting an output of said selectable finite-field constant multiplication means (b) to an input of said storage means (c);

means for connecting an output of said storage means (c) to a second input of said EXCLUSIVE-OR summing circuit means (a); and means for connecting an output of said time-multiplexed Linear Sequential Circuit means to said output of said selectable finite-field constant multiplication means (b); and further wherein said means for computing said coefficient $W_i$ comprises time-multiplexed Sum Of Products means comprising (e) selectable finite-field constant multiplication means;
(f) EXCLUSIVE-OR summing circuit means;
(g) first storage means;
(h) second storage means;

means for connecting an input of said selectable finite-field constant multiplication means (e) to said output of said time-multiplexed Linear Sequential Circuit means;

means for connecting an output of said selectable finite-field constant multiplication means (e) to a first input of said EXCLUSIVE-OR summing circuit means (f);

means for connecting an output of said EXCLUSIVE-OR summing circuit means (f) to an input of said first storage means (g);

means for connecting an output of said EXCLUSIVE-OR summing circuit means (f) to an input of said second storage means (h);

means for connecting an output of said first register means (g) to a second input of said EXCLUSIVE-OR summing circuit means (f); and means for connecting an output of said time-multiplexed Sum Of Products means to an output of said second storage means (h).

16. The encoder and frequency-domain syndrome generator circuit of claim 1 wherein said means for computing said plurality r of parameters $P_j$ and said plurality r of frequency-domain syndromes $S_j$ comprises time-multiplexed Linear Sequential Circuit means comprising (a) EXCLUSIVE-OR summing circuit means;
(b) storage means for storing said plurality r of parameters $P_j$ and said plurality r of frequency-domain syndromes $S_j$;
(c) selectable finite-field constant multiplication means;
(d) selection means for selecting one said selectable finite-field constants;

means for connecting a first input of said EXCLUSIVE-OR summing circuit means (a) to said data polynomial coefficients $I_i$ and said received codeword polynomial coefficients $C_i'$ and said write redundancy coefficients $W_i$;

means for connecting an output of said EXCLUSIVE-OR summing circuit means (a) to an input of said storage means (b);

means for connecting an output of said storage means (b) to an input of said selectable finite-field constant multiplication means (c);

means for connecting an output of said selectable finite-field constant multiplication means (c) to a second input of said EXCLUSIVE-OR summing circuit means (a); and means for connecting an output of said Linear Sequential Circuit means to said output of said selectable finite-field constant multiplication means (c); and further wherein said means for computing said coefficient $W_i$ comprises time-multiplexed Sum Of Products means comprising (e) selectable finite-field constant multiplication means;
(f) EXCLUSIVE-OR summing circuit means;
(g) first storage means;
(h) second storage means;

means for connecting an input of said selectable finite-field constant multiplication means (e) to said output of said time-multiplexed Linear Sequential Circuit means;

means for connecting an output of said selectable finite-field constant multiplication means (e) to a first input of said EXCLUSIVE-OR summing circuit means (f);

means for connecting an output of said EXCLUSIVE-OR summing circuit means (f) to an input of said first storage means (g);

means for connecting an output of said EXCLUSIVE-OR summing circuit means (f) to an input of said second storage means (h);

means for connecting an output of said first register means (g) to a second input of said EXCLUSIVE-OR summing circuit means (f); and means for connecting an output of said time-multiplexed Sum Of Products means to an output of said second storage means (h).

17. The encoder and frequency-domain syndrome generator circuit of claims 2, 3, 4, 5, 6, 7, 11, 12, 13, 14, 15, or 16 wherein said finite-field constant multiplication means comprises selection means for selecting one of said constant field elements comprising a plurality $\log_{2(r)}$ of lines;

first memory means having a plurality log$_{2(r)}$ of input lines connected to said clock signal means, a plurality m/2 of input lines connected to m/2 low-order bits of said variable field element, and a plurality m of output lines;

second memory means having a plurality log$_{2(r)}$ of input lines connected to said clock signal means, a plurality m/2 of input lines connected to m/2 high-order bits of said variable field element, and a plurality m of output lines; and EXCLUSIVE-OR summing circuit means having a plurality r of input lines connected to said r outputs of said first memory means, a plurality r of input lines connected to said r outputs of said second memory means, and a plurality m of output lines.

18. The encoder and frequency-domain syndrome generator circuit of claim 1 wherein m=8, r=16, m$_0$=0, G(x) is a GF(256) polynomial $$G(x) = \prod_{i=0}^{15} (x \oplus \alpha^i),$$

and $\alpha^i$ are elements of a finite field generated by a GF(2) polynomial $x^8 \oplus x^4 \oplus x^3 \oplus x^2 \oplus 1$.

19. The encoder and frequency-domain syndrome generator circuit of claim 1 wherein m=8, r=16, m$_0$=120, G(x) is a GF(256) polynomial $$G(x) = \prod_{i=0}^{15} (x \oplus \alpha^{120+i}),$$

and $\alpha^i$ are given by $\alpha^i = (\text{beta}^i)^{88}$ wherein beta$^i$ are elements of a finite field generated by a GF(2) polynomial $x^8 \oplus x^5 \oplus x^3 \oplus x^2 \oplus 1$.

20. In an error detection and correction system using a Reed-Solomon code for the detection and correction of a plurality of errors in a codeword C(x) comprising k data symbols and r check symbols wherein said k data symbols comprise coefficients I$_i$ of a data polynomial $$I(x) = \sum_{i=0}^{k-1} o\, I_i * x^i$$

and said r check symbols comprise coefficients W$_i$ of a write redundancy polynomial $$W(x) = \sum_{i=0}^{r-1} o\, W_i * x^i$$

and further wherein each said symbol comprises an element of a finite field GF(2$^m$) comprised of m binary bits of information, and a code generator polynomial G(x) of said code having a degree r+1 is given by $$G(x) = \prod_{j=0}^{r-1} (x \oplus \alpha^{m0+j}),$$

wherein m$_0$ is a parameter of said code, an encoder and frequency-domain syndrome generator circuit comprising (a) means for computing a plurality r of parameters $P_j = I(x) MOD(x \oplus \alpha^{m0+j})$ from said data polynomial I(x) wherein j varies from 0 to r−1 and each of said plurality r of parameters P$_j$ is updated with a coefficient I$_i$ of said data polynomial I(x) according to $P_j = \alpha^{m0+j} * P_j \oplus I_i$, a plurality of modified parameters $P_j' = \alpha^{m0+j} * P_j$, a plurality r of frequency-domain syndromes $S_j = C'(x) MOD(x \oplus \alpha^{m0+j})$ from a received codeword C'(x), wherein j varies from 0 to r−1 and each of said plurality r of frequency-domain syndromes S$_j$ is updated with a coefficient C$_i'$ of said received codeword C'(x) according to $S_j = \alpha^{m0+j} * S_j \oplus C_i'$, and a plurality of modified frequency-domain syndromes $S_j' = \alpha^{m0+j} * S_j$;

(b) means for computing a plurality r of coefficients W$_i$ of said write redundancy polynomial according to $$W_i = \sum_{j=0}^{r-1} K_{r-1,j}' * P_j',$$

wherein constants K$_{r-1,j}'$ are obtained by solution of a system of equations $$P_j' = \sum_{i=0}^{r-1} \alpha^{(i-r+1)(m0+j)} * W_i{p}; \text{ and}$$

(c) means for updating each of said plurality r of parameters P$_j$ with each of said coefficients W$_i$ according to $P_j = \alpha^{m0+j} * P_j \oplus W_i$, and for updating each of said plurality r of modified parameters P$_j'$ with each of said coefficients W$_i$ according to $P_j' = \alpha^{m0+j} * (\alpha^{m0+j} * P_j \oplus W_i)$.

21. The encoder and frequency-domain syndrome generator circuit of claim 20 wherein each said binary bit of each of said plurality r of parameters P$_j'$ before encoding, and each said binary bit of each of said plurality r of frequency-domain syndromes S$_j'$ before frequency-domain syndrome generation, is initialized to one.

22. In the encoder and frequency-domain syndrome generator circuit of claim 20, means for interleaving a plurality n of codewords comprising means for storing said plurality r of parameters $P_j'$ during encoding, and for storing said plurality r of frequency-domain syndromes $S_j'$ during frequency-domain syndrome generation, of a plurality n−1 of said codewords during processing of symbols from another of said codewords.

23. In the encoder and frequency-domain syndrome generator circuit of claim 20, self-checking means comprising means for recording an indicium of error when any of said plurality r of parameters $P_j'$ is not equal to zero after encoding is completed.

24. The encoder and frequency-domain syndrome generator circuit of claim 20 wherein $m=8$, $r=16$, $m_0=0$, $G(x)$ is a GF(256) polynomial $$G(x) = \prod_{i=0}^{15} (x \oplus \alpha^i),$$

and $\alpha^i$ are elements of a finite field generated by a GF(2) polynomial
$$x^8 \oplus x^4 \oplus x^3 \oplus x^2 \oplus 1.$$

25. The encoder and frequency-domain syndrome generator circuit of claim 20 wherein $m=8$, $r=16$, $m_0=120$, $G(x)$ is a GF(256) polynomial $$G(x) = \prod_{i=0}^{15} (x \oplus \alpha^{120+i}),$$

and $\alpha^i$ are given by $$\alpha^i = (\text{beta}^i)^{88}$$

wherein $\text{beta}^i$ are elements of a finite field generated by a GF(2) polynomial
$$x^8 \oplus x^5 \oplus x^3 \oplus x^2 \oplus 1.$$

* * * * *